(12) United States Patent
Guler et al.

(10) Patent No.: US 12,272,688 B2
(45) Date of Patent: Apr. 8, 2025

(54) SELECTIVE GROWTH SELF-ALIGNED GATE ENDCAP (SAGE) ARCHITECTURES WITHOUT FIN END GAP

(71) Applicant: Intel Corporation, Santa Clara, CA (US)

(72) Inventors: Leonard P. Guler, Hillsboro, OR (US); Zachary Geiger, Hillsboro, OR (US); Glenn A. Glass, Portland, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 938 days.

(21) Appl. No.: 17/026,052

(22) Filed: Sep. 18, 2020

(65) Prior Publication Data

US 2022/0093590 A1 Mar. 24, 2022

(51) Int. Cl.
*H01L 27/088* (2006.01)
*H01L 29/423* (2006.01)

(52) U.S. Cl.
CPC .... *H01L 27/0886* (2013.01); *H01L 29/42364* (2013.01)

(58) Field of Classification Search
CPC ................ H01L 21/823431; H01L 29/42364
See application file for complete search history.

(56) References Cited

U.S. PATENT DOCUMENTS

| 11,043,492 | B2 | 6/2021 | Liao et al. | |
|---|---|---|---|---|
| 2013/0277760 | A1* | 10/2013 | Lu | H01L 29/785 257/E27.06 |
| 2016/0380052 | A1* | 12/2016 | Kim | H01L 29/785 257/401 |
| 2018/0315607 | A1* | 11/2018 | Sharma | H01L 27/0886 |
| 2019/0139957 | A1* | 5/2019 | Liao | H01L 27/0924 |
| 2019/0157310 | A1* | 5/2019 | Glass | H01L 27/1203 |
| 2019/0221649 | A1* | 7/2019 | Glass | H01L 21/823418 |
| 2019/0287966 | A1* | 9/2019 | Guler | H01L 21/30604 |
| 2019/0304971 | A1* | 10/2019 | Hafez | H01L 21/823431 |
| 2019/0305112 | A1* | 10/2019 | Subramanian | H01L 29/66545 |
| 2020/0220016 | A1* | 7/2020 | Guler | H01L 29/6681 |
| 2021/0091075 | A1 | 3/2021 | Liao et al. | |

FOREIGN PATENT DOCUMENTS

WO WO 2018004680 1/2018
WO WO-2018004680 A1 * 1/2018 ....... H01L 21/76895

* cited by examiner

*Primary Examiner* — Vincent Wall
(74) *Attorney, Agent, or Firm* — Schwabe, Willioamson & Wyatt, P.C.

(57) ABSTRACT

Self-aligned gate endcap (SAGE) architectures without fin end gaps, and methods of fabricating self-aligned gate endcap (SAGE) architectures without fin end gaps, are described. In an example, an integrated circuit structure includes a semiconductor fin having a cut along a length of the semiconductor fin. A gate endcap isolation structure is in a location of the cut of the semiconductor fin and in contact with the semiconductor fin.

14 Claims, 25 Drawing Sheets

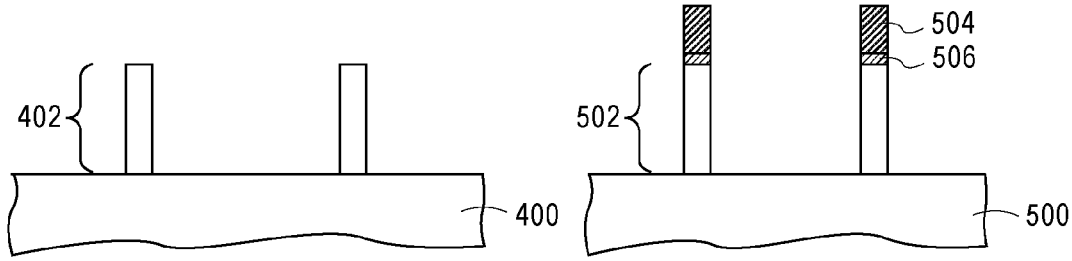
FIG. 4A (Prior Art)     FIG. 5A (Prior Art)
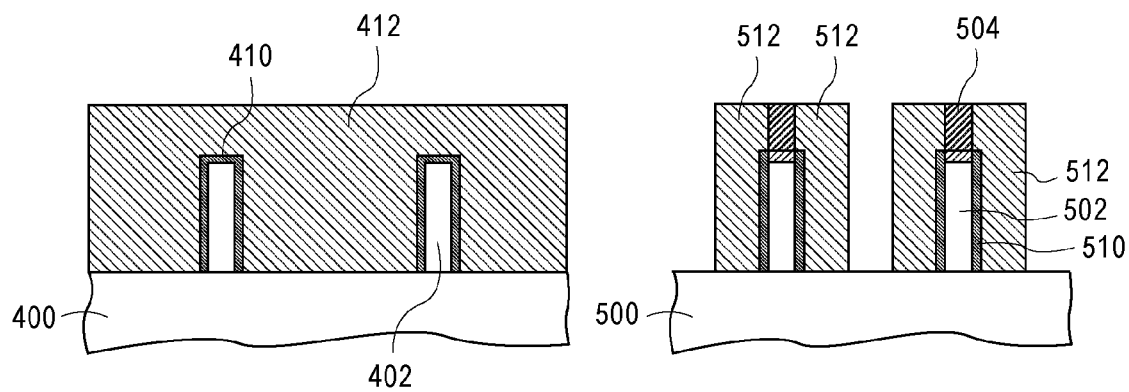
FIG. 4B (Prior Art)     FIG. 5B (Prior Art)

SELECTIVE GROWTH SELF-ALIGNED GATE ENDCAP (SAGE) ARCHITECTURES WITHOUT FIN END GAP

TECHNICAL FIELD

Embodiments of the disclosure are in the field of semiconductor devices and processing and, in particular, self-aligned gate endcap (SAGE) architectures without fin end gaps, and methods of fabricating self-aligned gate endcap (SAGE) architectures without fin end gaps.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4D illustrate cross-sectional views of process operations of significance in a conventional finFET or tri-gate process fabrication scheme.

FIGS. 5A-5D illustrate cross-sectional views of process operations of significance in a self-aligned gate endcap process fabrication scheme for finFET or tri-gate devices, in accordance with an embodiment of the present disclosure.

DESCRIPTION OF THE EMBODIMENTS

Figure 1:
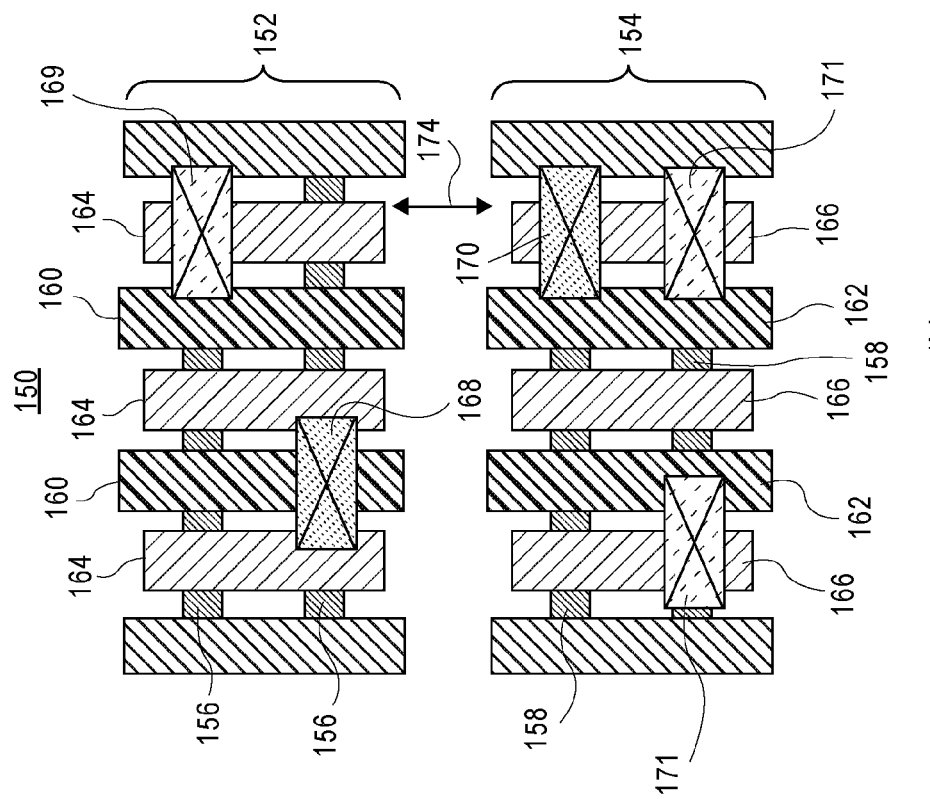
FIG. 1 illustrates plan views of adjacent integrated circuit structures for a conventional architecture with relatively wide spacing (left-hand side (a)) versus adjacent integrated circuit structures for a self-aligned gate endcap (SAGE) architecture with relatively tight spacing (right-hand side (b)), in accordance with an embodiment of the present disclosure.
Figure 1:
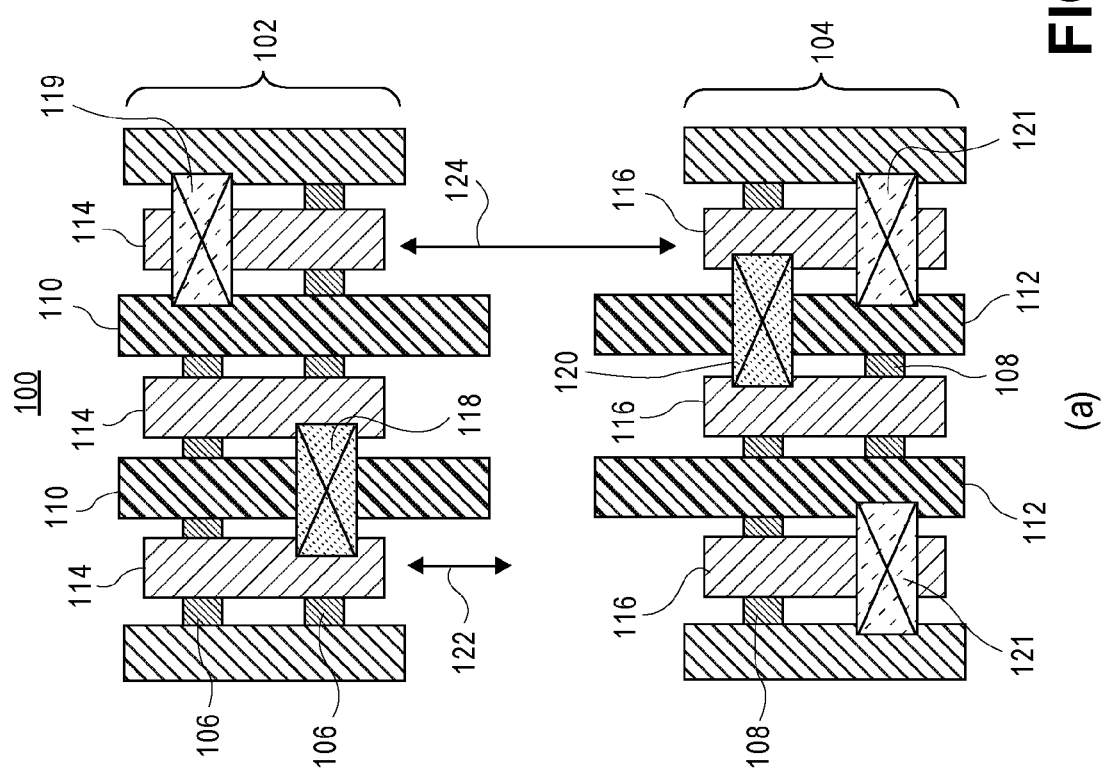

Self-aligned gate endcap (SAGE) architectures without fin end gaps, and methods of fabricating self-aligned gate endcap (SAGE) architectures without fin end gaps, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to semiconductor structures or devices having one or more gate endcap structures. Additionally, methods of fabricating gate endcap isolation structures in a self-aligned manner are also described. In one or more embodiments, selective growth is used to fabricate fin sidewall spacers to form self-aligned gate endcap (SAGE) structures without fin end gaps. Embodiments described herein may address issues associated with scaling diffusion end-to-end spacing in an ultra-scaled process technology.

In accordance with one or more embodiments described herein, selective growth SAGE wall formation is described. In one embodiment, an epitaxially grown germanium (Ge) film is used to generate as a SAGE wall spacer. The approach can be implemented to create a SAGE wall that directly abuts a fin end. The above is in comparison to a process flow in which a SAGE wall is shifted away from a fin end by a thickness of the SAGE spacer, which can cause various yield problems that often need to be addressed by costly compensations.

To provide context, it is possible to use dielectric isolation walls to constrain device cell size and enable self-alignment of various features. Such isolation walls may either be taller than the semiconductor fins used to build devices or they may be the same height. The formation of isolation wall structures can involve covering the semiconducting fins with a dielectric spacer. Due to the conformality of the spacer, a similar size gap may be created between both the sidewalls and ends of the fins and the isolation walls. Subsequent patterning of a gate line (e.g., poly-Si) orthogonal to the direction of the semiconductor fins can lead to poly-Si filling the small gap between fin ends and the isolation wall, examples of which are described below in association with FIG. 6. Subsequent removal of such sacrificial poly-Si gate material and replacement with the gate metal material can lead to filling of the entire gap between the ends of the fins and the isolation walls. The resulting spreading out of the gate metal at the fin end can lead to decreased electrical shorting margin and therefore decreased device yield. In accordance with one or more embodiments described herein, a method to avoid the formation of a gap between fin ends and the isolation wall is described in order to increase gate to contact shorting margin in such a device architecture.

To provide broader context, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after.

To provide a foundation to highlight advantages of embodiments of the present disclosure, it is first to be appreciated that advantages of a self-aligned gate endcap (SAGE) architecture over non-SAGE approaches may include the enabling of higher layout density and, in particular, scaling of diffusion to diffusion spacing. As an example, FIG. 1 illustrates plan views of adjacent integrated circuit structures for a conventional architecture with relatively wide spacing (left-hand side (a)) versus adjacent integrated circuit structures for a SAGE architecture with relatively tight spacing (right-hand side (b)), in accordance with an embodiment of the present disclosure.

Referring to the left-hand side (a) of FIG. 1, a layout 100 includes first 102 and second 104 integrated circuit structures based on semiconductor fins 106 and 108, respectively. Each device 102 and 104 has a gate electrode 110 or 112, respectively. Additionally, each device 102 and 104 has trench contacts (TCNs) 114 or 116, respectively, at source and drain regions of the fins 106 and 108, respectively. Gate vias 118 and 120, and trench contact vias 119 and 121 are also depicted.

Referring again to the left-hand side (a) of FIG. 1, the gate electrodes 110 and 112 have a relatively wide end cap region 122, which is located off of the corresponding fins 106 and 108, respectively. The TCNs 114 and 116 each have a relatively large end-to-end spacing 124, which is also located off of the corresponding fins 106 and 108, respectively.

By contrast, referring to the right-hand side (b) of FIG. 1, a layout 150 includes first 152 and second 154 integrated circuit structures based on semiconductor fins 156 and 158, respectively. Each device 152 and 154 has a gate electrode 160 or 162, respectively. Additionally, each device 152 and 154 has trench contacts (TCNs) 164 or 166, respectively, at source and drain regions of the fins 156 and 158, respectively. Gate vias 168 and 170, and trench contact vias 169 and 171 are also depicted.

Referring again to the right-hand side (b) of FIG. 1, the gate electrodes 160 and 162 have a relatively tight end cap region, which is located off of the corresponding fins 156 and 158, respectively. The TCNs 164 and 166 each have a relatively tight end-to-end spacing 174, which is also located off of the corresponding fins 156 and 158, respectively.

To provide further context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 2 illustrates a plan view of a conventional layout 200 including fin-based semiconductor devices accommodating end-to-end spacing.

Figure 2:
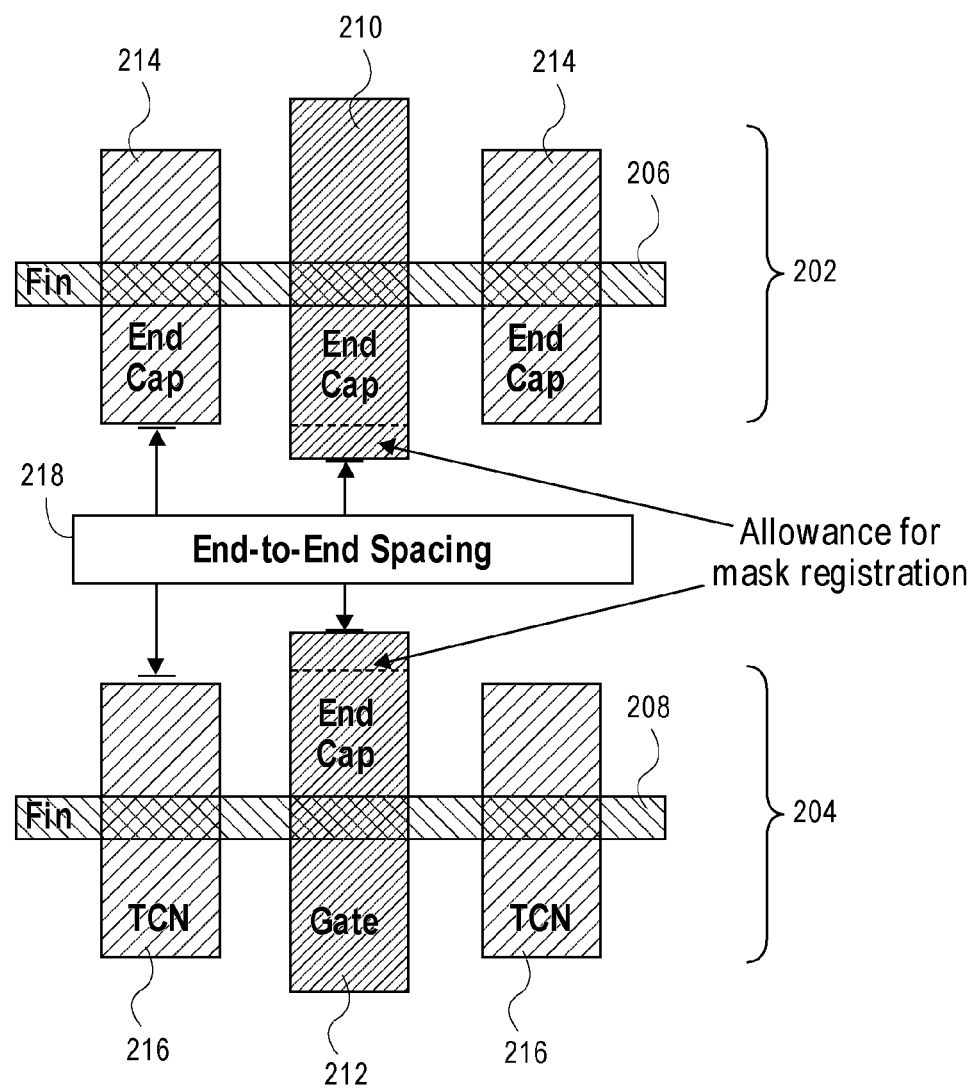
FIG. 2 illustrates a plan view of a conventional layout including fin-based semiconductor devices accommodating end-to-end spacing.

Referring to FIG. 2, first 202 and second 204 semiconductor devices are based on semiconductor fins 206 and 208, respectively. Each device 202 and 204 has a gate electrode 210 or 212, respectively. Additionally, each device 202 and 204 has trench contacts (TCNs) 214 or 216, respectively, at source and drain regions of the fins 206 and 208, respectively. The gate electrodes 210 and 212 and the TCNs 214 and 216 each have an end cap region, which is located off of the corresponding fins 206 and 208, respectively.

Referring again to FIG. 2, typically, gate and TCN endcap dimensions must include an allowance for mask registration error to ensure robust transistor operation for worst case mask mis-registration, leaving an end-to-end spacing 218. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin sidewalls which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 3 illustrates cross-sectional views taken through fins for a conventional architecture (left-hand side (a)) versus a self-aligned gate endcap (SAGE) architecture (right-hand side (b)), in accordance with an embodiment of the present disclosure.

Figure 3:
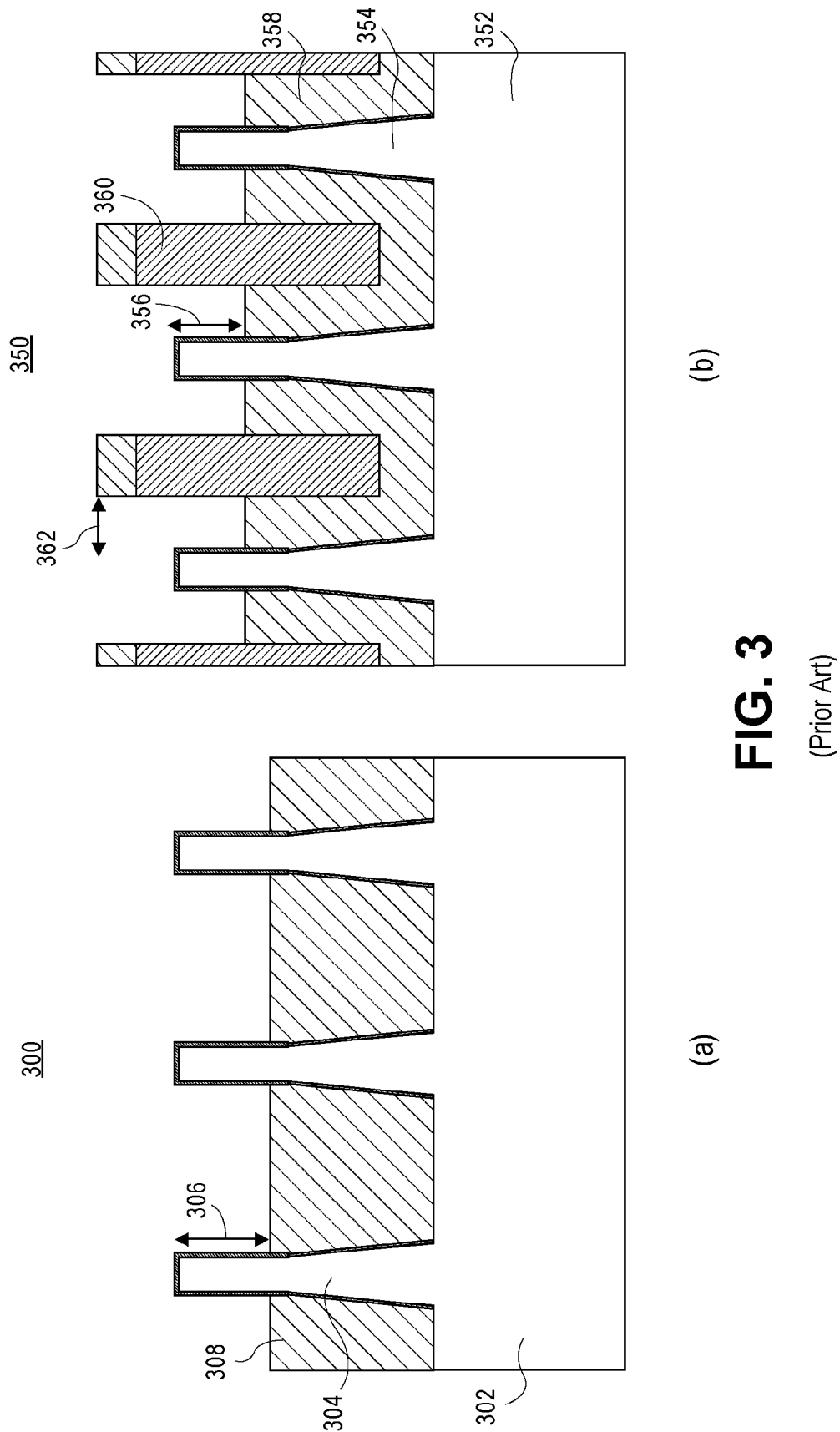
FIG. 3 illustrates cross-sectional views taken through fins for a conventional architecture (left-hand side (a)) versus a self-aligned gate endcap (SAGE) architecture (right-hand side (b)), in accordance with an embodiment of the present disclosure.

Referring to the left-hand side (a) of FIG. 3, an integrated circuit structure 300 includes a substrate 302 having fins 304 protruding therefrom. A height ($H_{Si}$) 306 of an active portion of the fins 304 is set by an isolation structure 308 laterally surrounding lower portions of the fins 304. A gate structure may be formed over the integrated circuit structure 300 to fabricate a device. However, breaks in such a gate structure are accommodated for by increasing the spacing between fins 304.

By contrast, referring to the right-hand side (b) of FIG. 3, an integrated circuit structure 350 includes a substrate 352 having fins 354 protruding therefrom. A height ($H_{Si}$) 356 of an active portion of the fins 354 is set by an isolation structure 358 laterally surrounding lower portions of the fins 354. Isolating SAGE walls 360 (which may include a hardmask thereon, as depicted) are included within the isolation structure 358 and between adjacent fins 354. The distance between an isolating SAGE wall 360 and a nearest fin 354 defines the gate endcap spacing 362. A gate structure may be formed over the integrated circuit structure 350, between insolating SAGE walls 360 to fabricate a device. Breaks in such a gate structure are imposed by the isolating SAGE walls 360. Since the isolating SAGE walls 360 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 360.

In order to provide a side-by-side comparison, FIGS. 4A-4D illustrate cross-sectional views of process operations of significance in a conventional finFET or tri-gate process fabrication scheme, while FIGS. 5A-5D illustrate cross-sectional views of process operations of significance in a self-aligned gate endcap process fabrication scheme for finFET or tri-gate devices, in accordance with an embodiment of the present disclosure.

Referring to FIGS. 4A and 5A, a bulk semiconductor substrate 400 or 500, such as a bulk single crystalline silicon substrate is provided having fins 402 or 502, respectively, etched therein. In an embodiment, the fins are formed directly in the bulk substrate 400 or 500 and, as such, are formed continuous with the bulk substrate 400 or 500. It is to be appreciated that within the substrate 400 or 500, shallow trench isolation structures may be formed between fins. Referring to FIG. 5A, a hardmask layer 504, such as a silicon nitride hardmask layer, and a pad oxide layer 506, such as a silicon dioxide layer, remain atop fins 502 following patterning to form the fins 502. By contrast, referring to FIG. 4A, such a hardmask layer and pad oxide layer have been removed.

Referring to FIG. 4B, a dummy or permanent gate dielectric layer 410 is formed on the exposed surfaces of the semiconductor fins 402, and a dummy gate layer 412 is formed over the resulting structure. By contrast, referring to FIG. 5B, a dummy or permanent gate dielectric layer 510 is formed on the exposed surfaces of the semiconductor fins 502, and dummy spacers 512 are formed adjacent to the resulting structure.

Figure 4C:
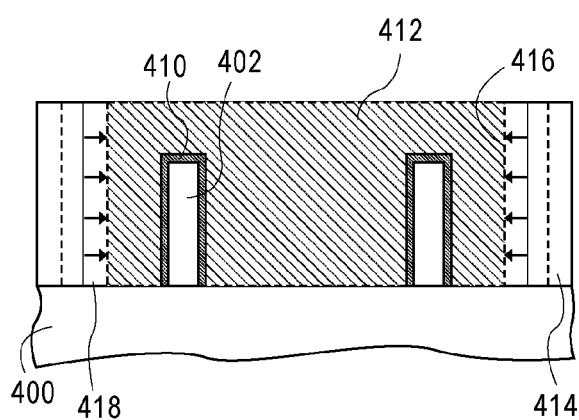

Referring to FIG. 4C, gate endcap cut patterning is performed and isolation regions 414 are formed at the resulting patterned dummy gate ends 416. In the conventional process scheme, a larger gate endcap must be fabricated to allow for gate mask mis-registration, as depicted by the arrowed regions 418. By contrast, referring to FIG. 5C, self-aligned isolation regions 514 are formed by providing an isolation layer over the structure of FIG. 5B, e.g., by deposition and planarization. In one such embodiment, the self-aligned gate endcap process does not require extra space for mask registration, as compared in FIGS. 4C and 5C.

Figure 4D:
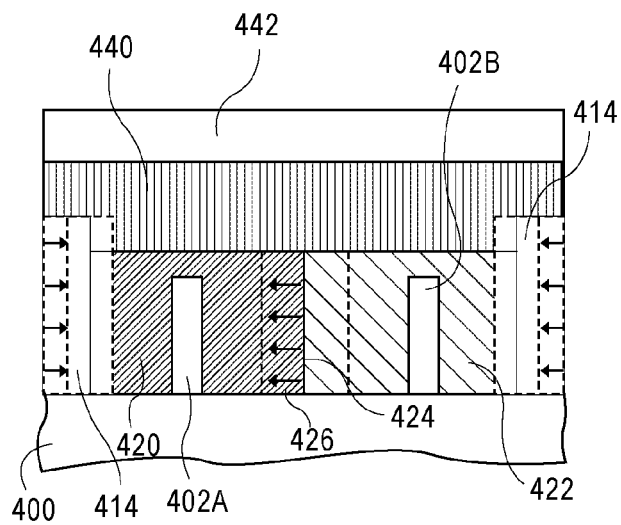

Referring to FIG. 4D, the dummy gate electrode 412 of FIG. 4C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 420 over a first semiconductor fin 402A and to provide a P-type gate electrode 422 over a second semiconductor fin 402B. The N-type gate electrode 420 and the P-type gate electrode 422 are formed between the isolation regions 414, but form a P/N junction 424 where they meet. The exact location of the P/N junction 424 may vary, depending on mis-registration, as depicted by the arrowed region 426.

Figure 5C:
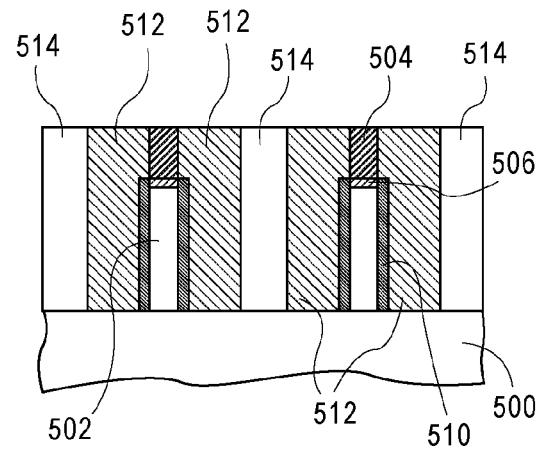
Figure 5D:
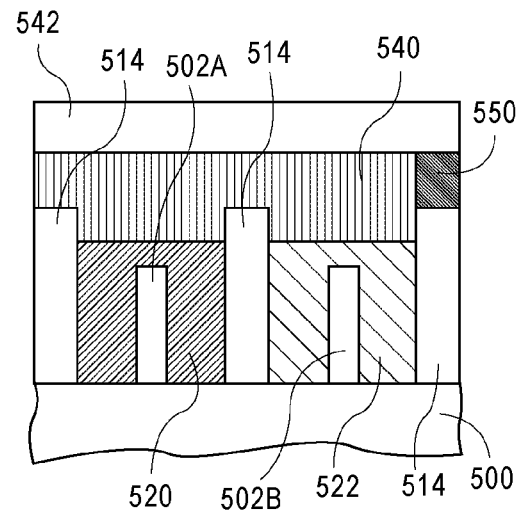

By contrast, referring to FIG. 5D, the hardmask layer 504 and pad oxide layer 506 are removed, and the dummy spacers 514 of FIG. 5C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 520 over a first semiconductor fin 502A and to provide a P-type gate electrode 522 over a second semiconductor fin 502B. The N-type gate electrode 520 and the P-type gate electrode 522 are formed between, and are also separated by, the gate endcap isolations structures 514.

Referring again to FIG. 4D, a local interconnect 440 may be fabricated to contact N-type gate electrode 420 and P-type gate electrode 422 to provide a conductive path around the P/N junction 424. Likewise, referring to FIG. 5D, a local interconnect 540 may be fabricated to contact N-type gate electrode 520 and P-type gate electrode 522 to provide a conductive path over the intervening isolation structure 514 there between. Referring to both FIGS. 4D and 5D, a hardmask 442 or 542 may be formed on the local interconnect 440 or 540, respectively. Referring to FIG. 5D in particular, in an embodiment, the continuity of the local interconnect 540 is interrupted by a dielectric plug 550 in cases where a break in electrical contact along a gate line are needed.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Embodiments of the present disclosure may be implemented to improve upon a SAGE wall formation method and location. Embodiments described herein may address difficulties in forming bi-directional SAGE walls resulting from the introduction of fin cuts. To provide context, a SAGE architecture may be implemented by fabricating a SAGE isolation structure after a process of cutting the fins to remove fin portions in select locations. It is to be appreciated that logic devices may be aggressively scaled in dimension, creating fabrication and yield challenges for gate and contact end cap patterning. A state-of-the-art self-aligned gate endcap (SAGE) architecture provides a potential landing spot for a gate or contact plug. The SAGE wall formation is self-aligned in the x-direction but only partly aligned in the y-direction since the SAGE architecture may be susceptible to contact to gate shorts at the fin end caps due to registration constraints at various lithographic patterning layers.

Figure 6:
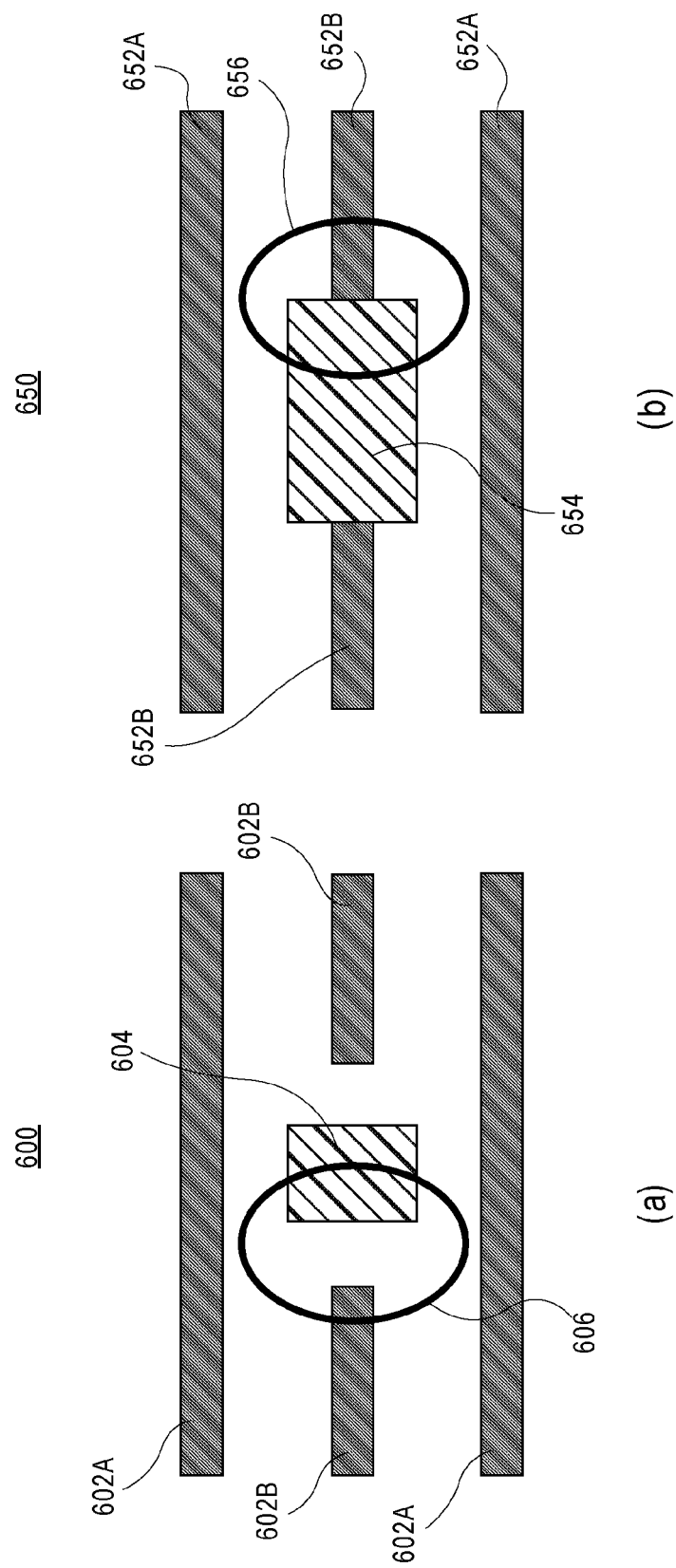
FIG. 6 illustrates plan views providing a comparison of a self-aligned gate endcap (SAGE) structure (a) with a fin end gap to a self-aligned gate endcap (SAGE) structure (b) without a fin end gap, in accordance with an embodiment of the present disclosure.

For comparative purposes, FIG. 6 illustrates plan views providing a comparison of a self-aligned gate endcap (SAGE) structure (a) with a fin end gap to a self-aligned gate endcap (SAGE) structure (b) without a fin end gap, in accordance with an embodiment of the present disclosure. It is to be appreciated that a device structure can be fabricated with an isolation wall taller than a semiconductor fin or at the same height with a location of gate-to-contact shorting at fin end gaps, or the gaps may be eliminated for both such structures.

Referring to part (a) of FIG. 6, a structure 600 includes uncut fins 602A and a cut fin 602B. A SAGE wall 604 is between segments of the cut fin 602B. A gap 606 is between the SAGE wall 604 and the segments of the cut fin 602B. The gap 606 can lead to issues during downstream processing.

By contrast to part (a) of FIG. 6, referring to part (b) of FIG. 6, a structure 650 includes uncut fins 652A and a cut fin 652B. A SAGE wall 654 is between segments of the cut fin 652B. There is no gap between the SAGE wall 654 and the segments of the cut fin 652B, e.g., at location 656.

Embodiments described herein may be implemented to enable the growth of a dielectric isolation wall directly up against the end of a semiconducting fin transistor structure using selective growth. A process flow can be implemented for generating fin spacers on only the sidewalls and not the fin ends. In an exemplary processing scheme, FIGS. 7A-7O illustrate top-down views representing various operations in a process for fabricating self-aligned gate endcap (SAGE) structures without fin end gaps, in accordance with an embodiment of the present disclosure.

Figure 7A:
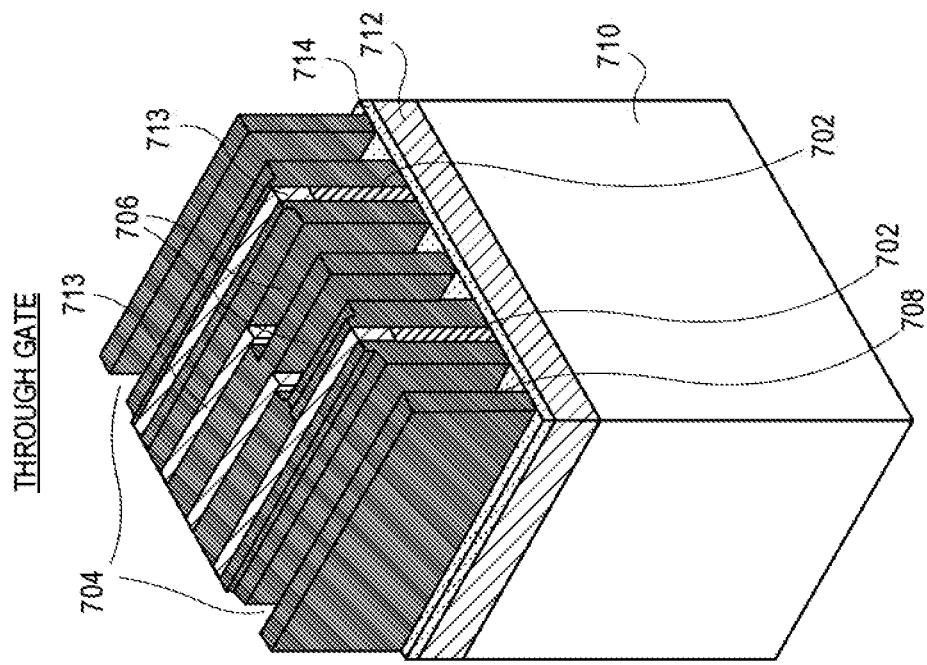
FIGS. 7A-7O illustrate top-down views representing various operations in a process for fabricating self-aligned gate endcap (SAGE) structures without fin end gaps, in accordance with an embodiment of the present disclosure.
Figure 7A:
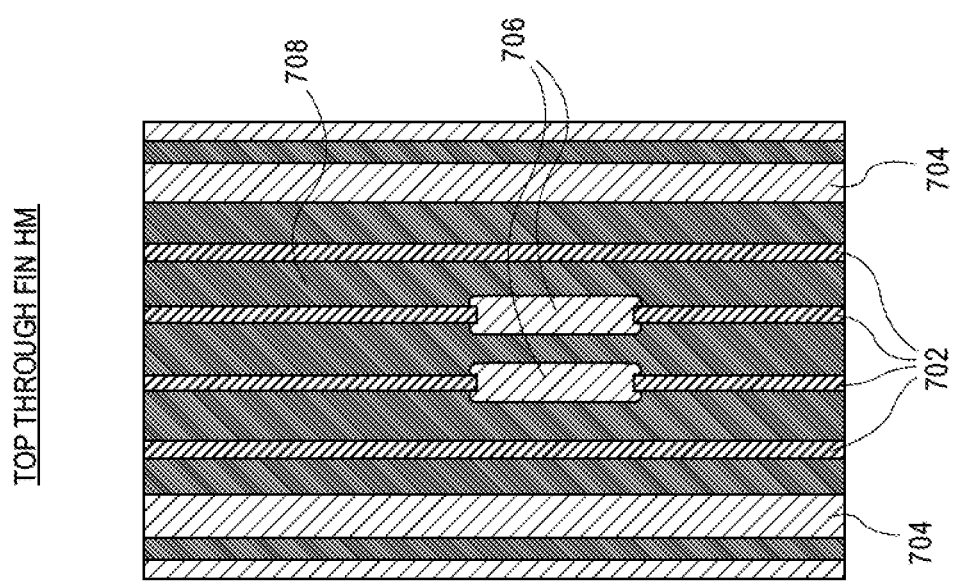

Referring to FIG. 7A, a starting structure 700 includes amorphous silicon fin hardmask 702 following a fin cut operation to form removed locations 704, and to form cut locations 706 between fin hardmask ends. Dielectric spacers 708, such as silicon oxide spacers, are along amorphous silicon fin hardmask 702 and along locations where fin hardmask portions have been removed. A top hardmask layer 713 is on remaining portions of the amorphous silicon fin hardmask 702. The amorphous silicon fin hardmask 702 are over a first hardmask layer 714 (such as a TiN hardmask layer) on a second hardmask layer 712 (such as a silicon nitride layer) on a substrate 710, such as a silicon substrate.

Figure 7B:
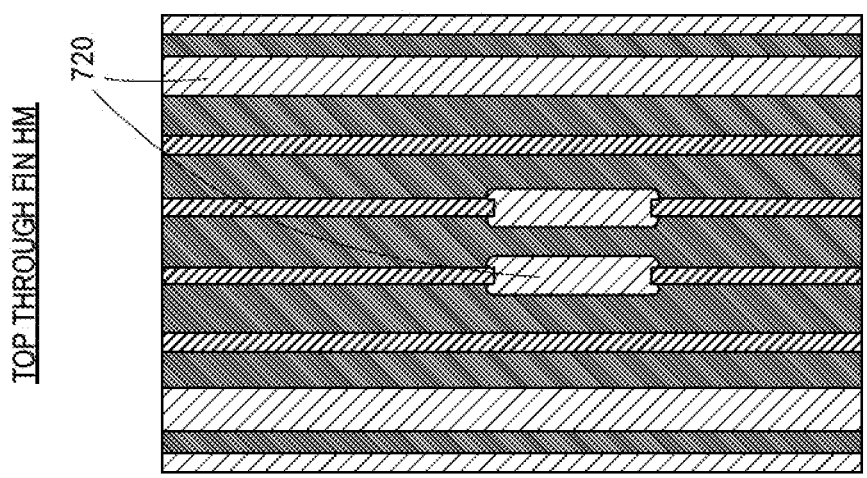
Figure 7B:
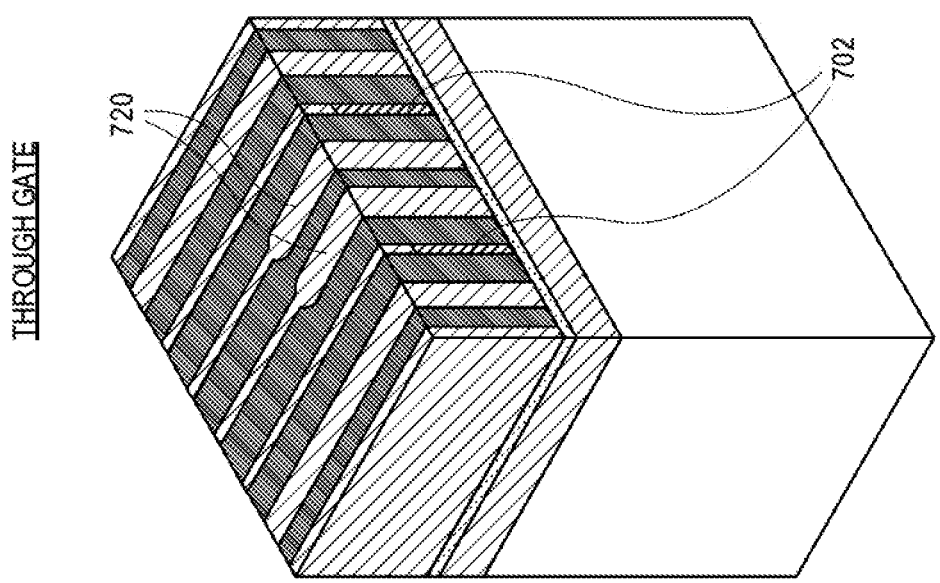
Figure 7C:
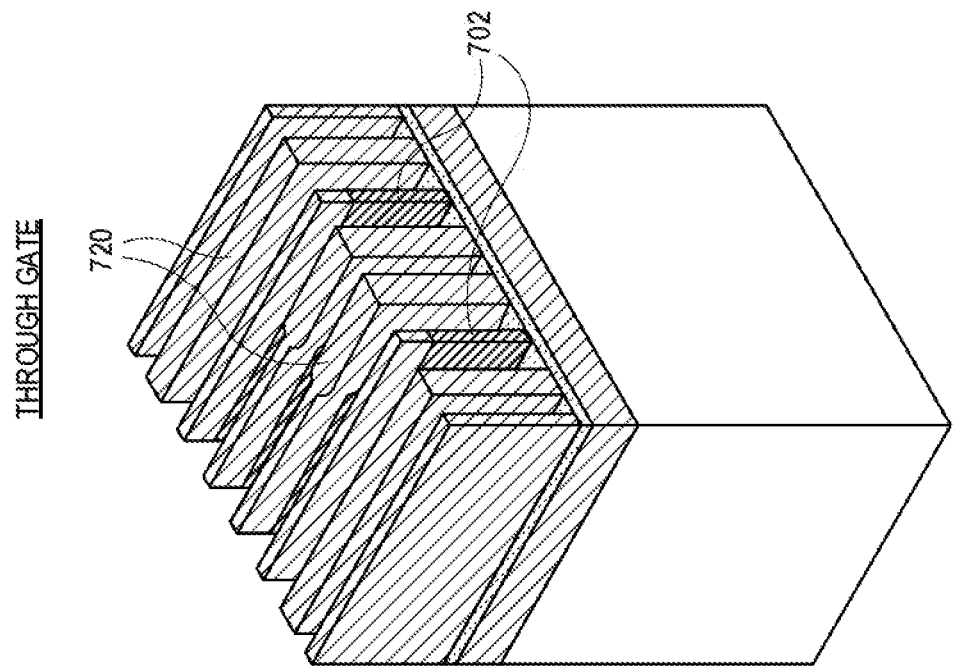
Figure 7C:
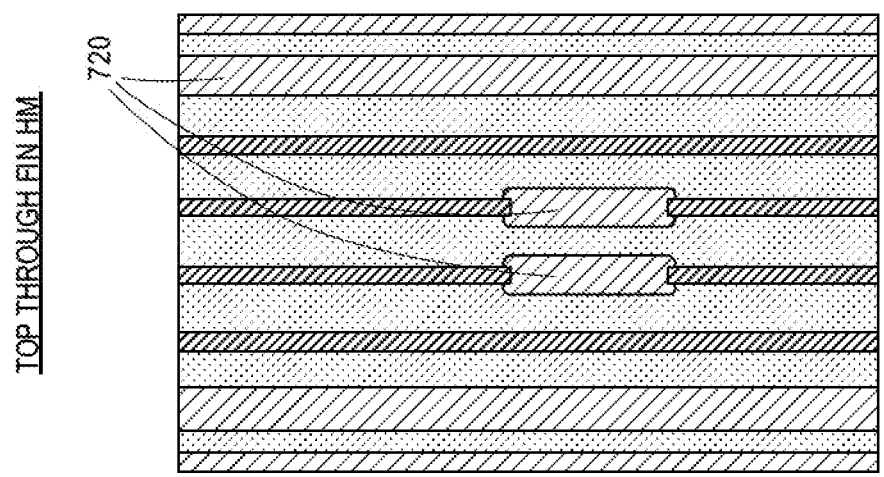

Referring to FIG. 7B, a fill dielectric 720, such as a silicon nitride fill dielectric, is formed and planarized over the structure of FIG. 7A. The dielectric spacers 708 are then removed, as is depicted in FIG. 7C.

Figure 7D:
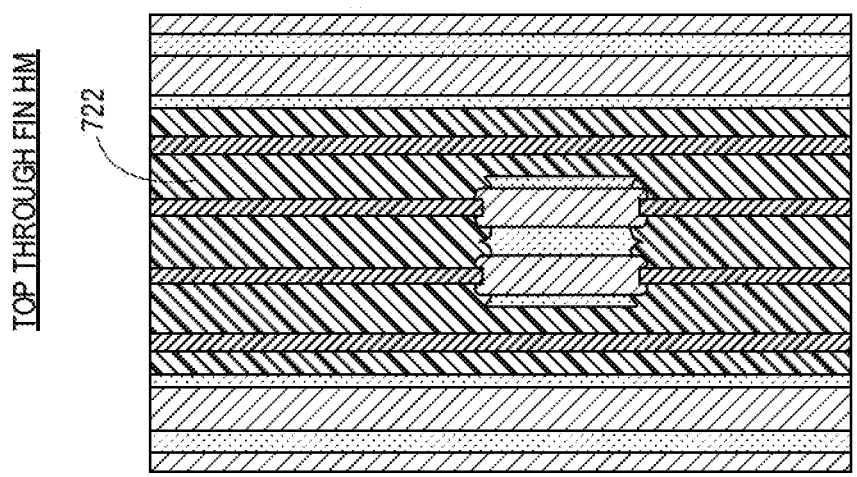
Figure 7D:
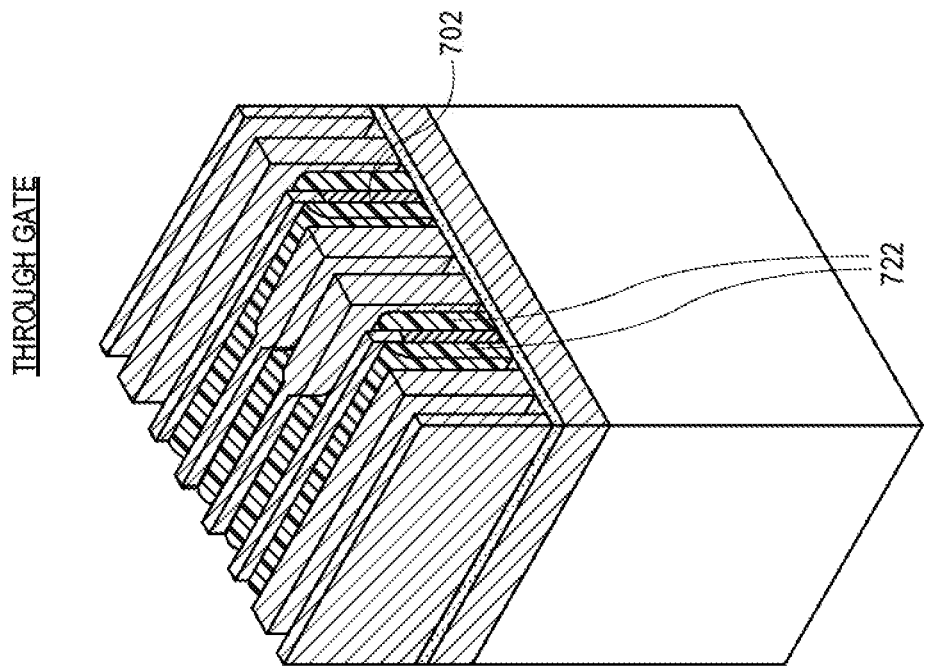
Figure 7E:
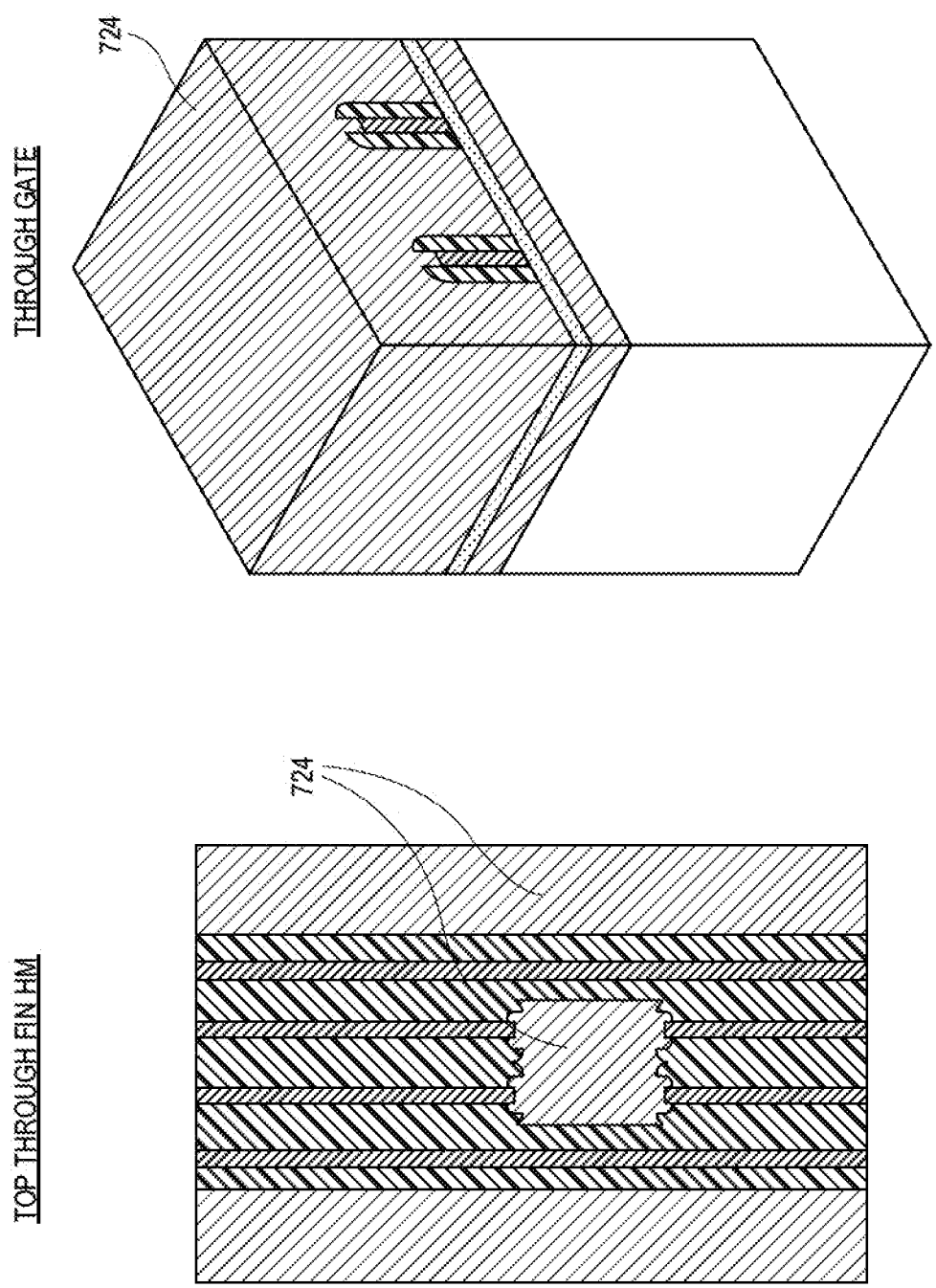

Referring to FIG. 7D, selective growth of germanium is performed on exposed surfaces of the amorphous silicon fin hardmask 702 to form germanium spacers 722. A backfill process is then performed to form a dielectric block 724, such as a silicon nitride dielectric block, as is depicted in FIG. 7E.

Figure 7F:
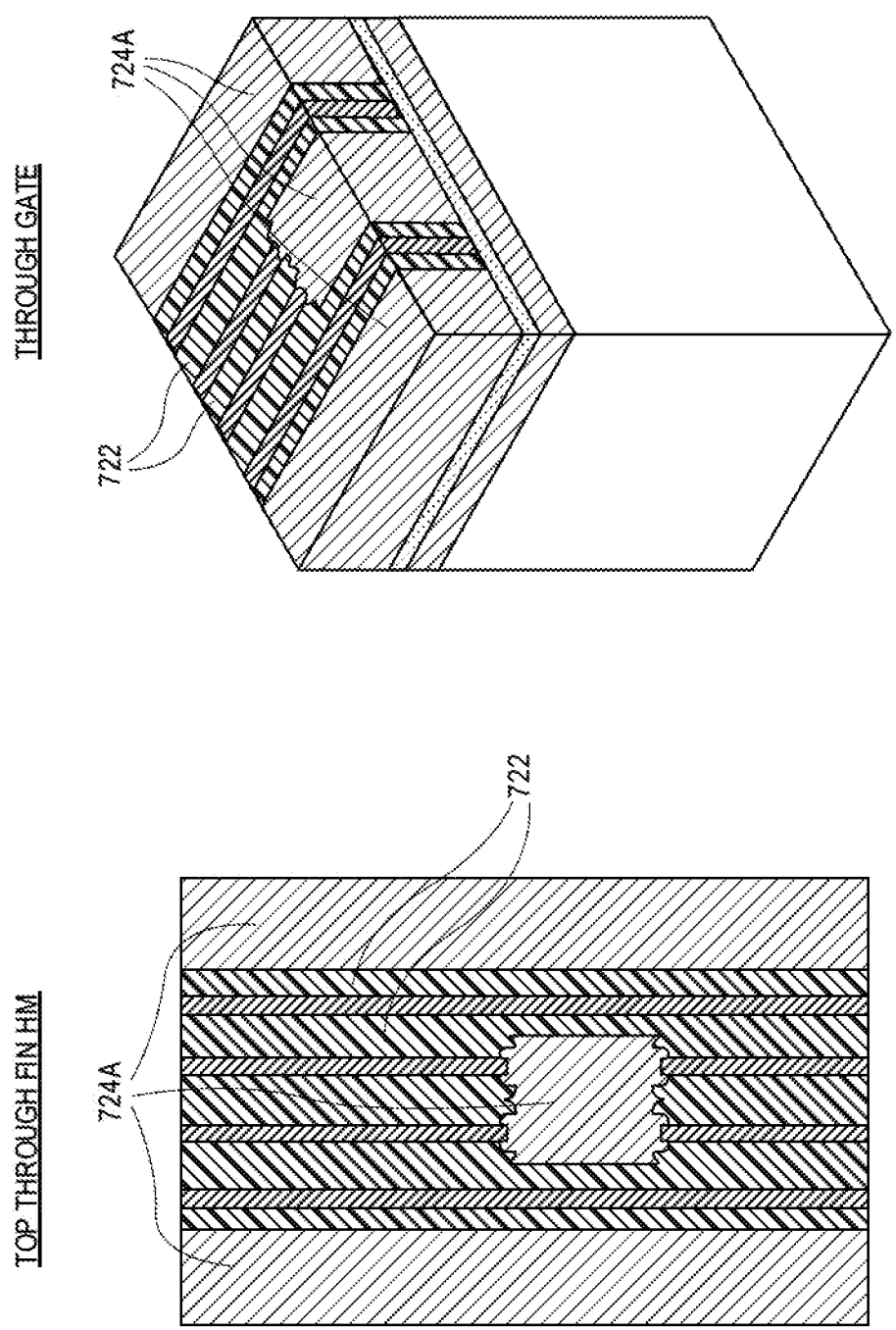

Referring to FIG. 7F, the dielectric block 724 is planarized to expose the germanium spacers 722 and to form planarized dielectric block 724A. The germanium spacers 722 are then removed in a selective etch process, such as is depicted in FIG. 7G.

Figure 7G:
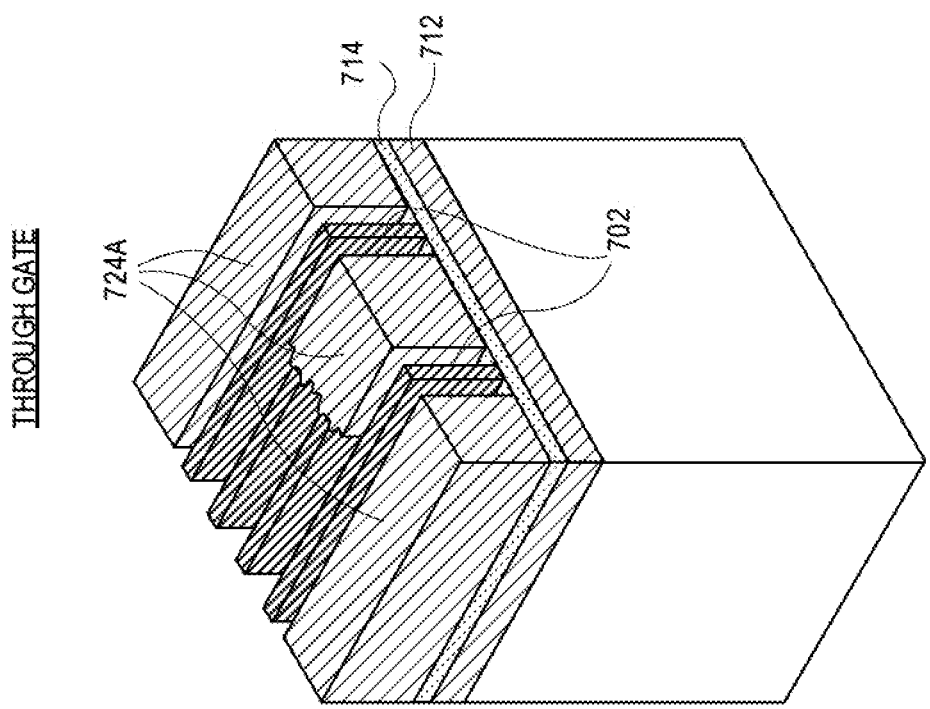
Figure 7G:
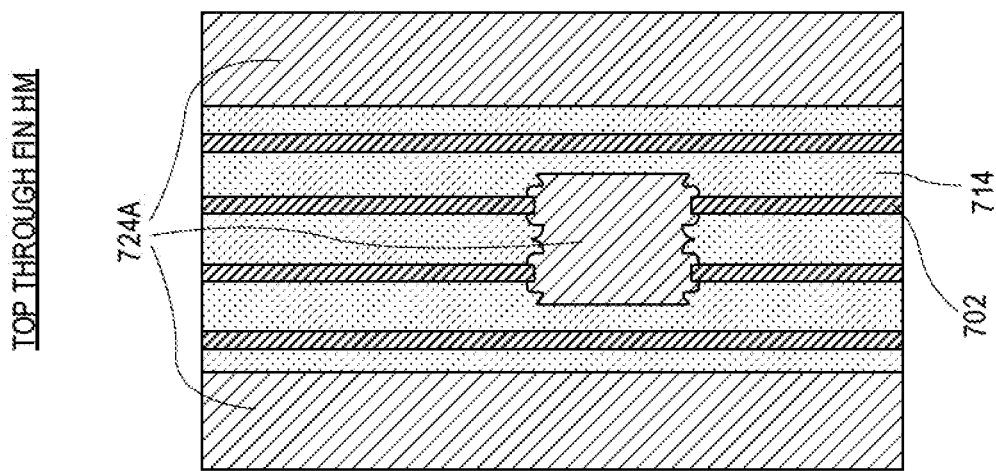
Figure 7H:
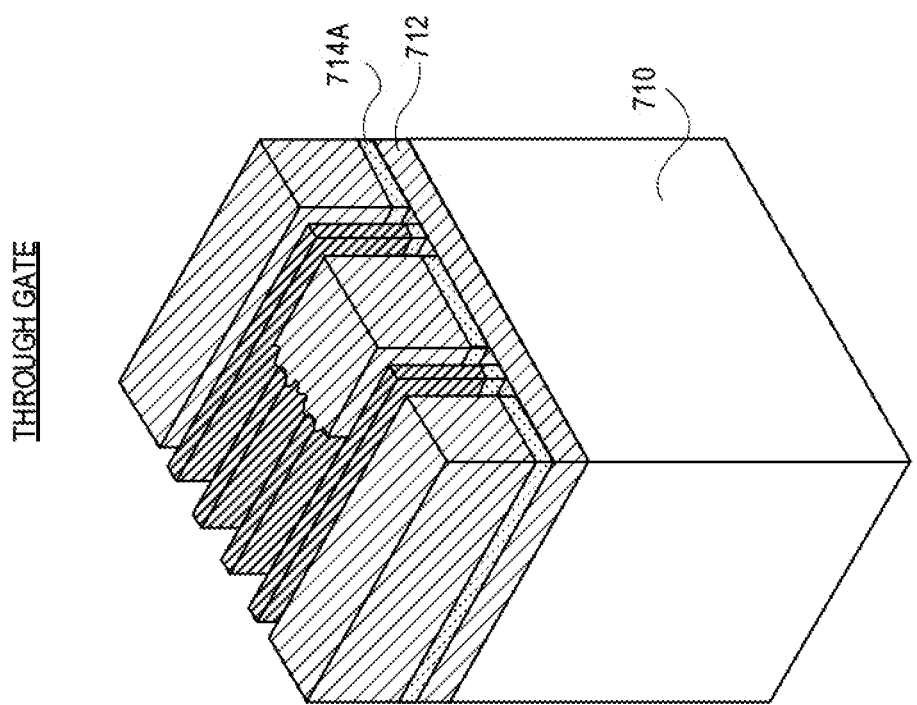
Figure 7H:
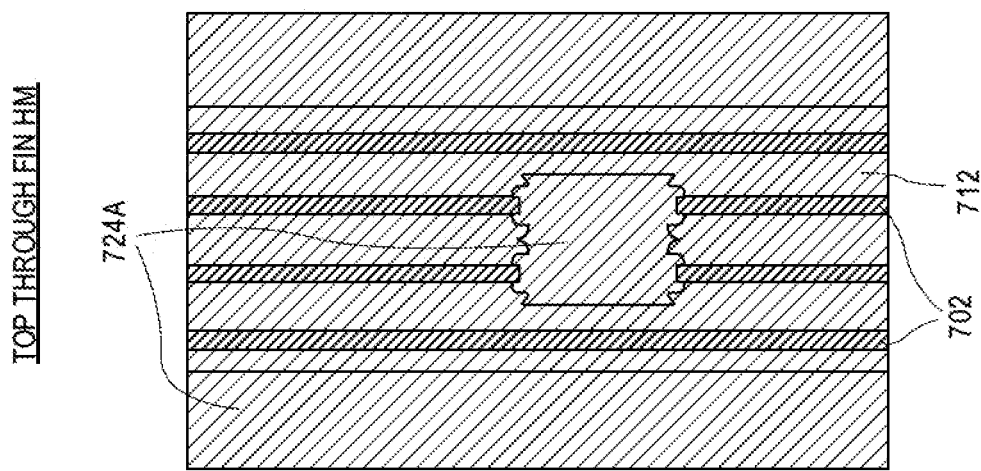
Figure 7I:
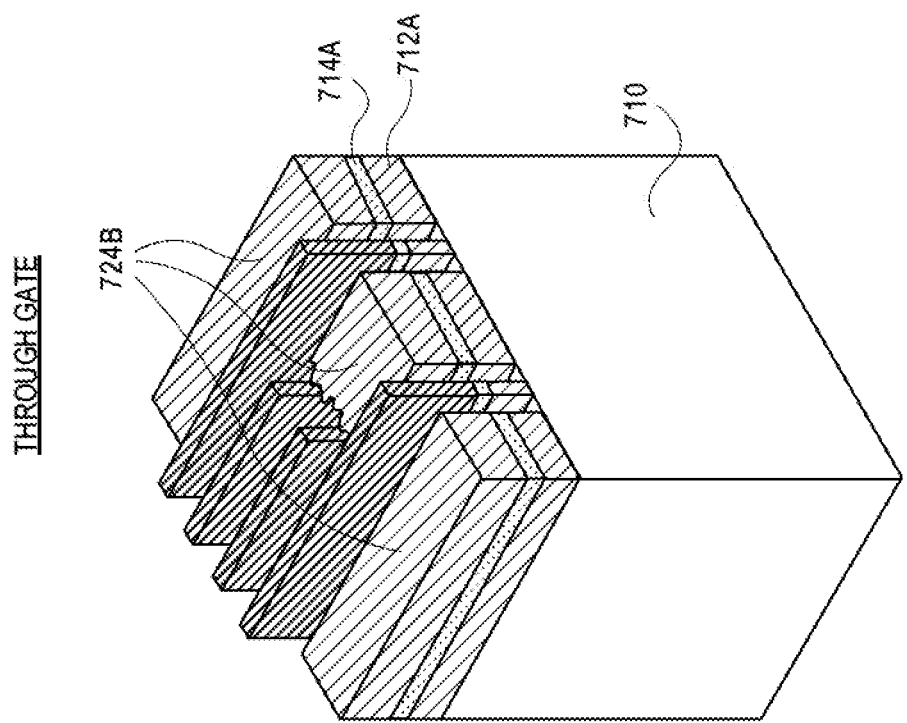
Figure 7I:
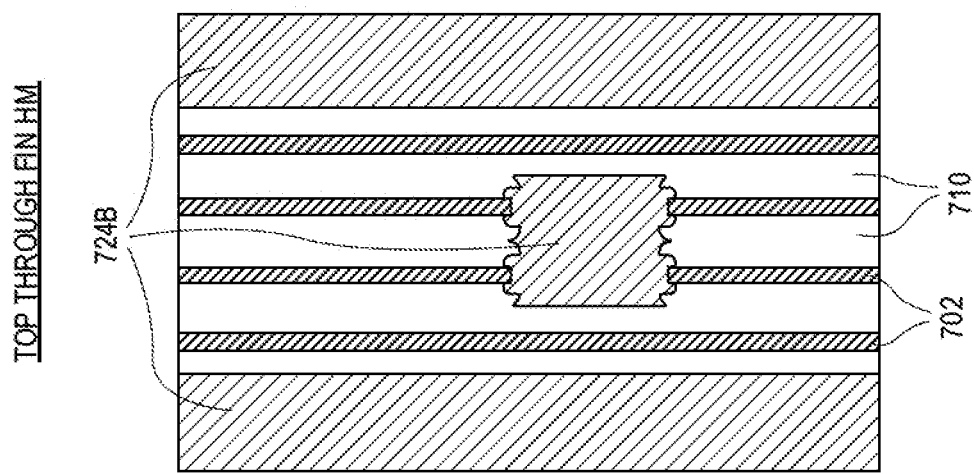

Referring to FIG. 7H, the structure of FIG. 7G is subjected to an etch process to etch first hardmask layer 714 to form patterned first hardmask layer 714A, exposing second hardmask layer 712. The structure of FIG. 7H is subjected to an etch process to etch second hardmask layer 712 to form patterned second hardmask layer 712A, exposing substrate 710, as is depicted in FIG. 7I. The etching also recesses planarized dielectric block 724A to form recessed dielectric block 724B, as is also depicted in FIG. 7I.

Figure 7J:
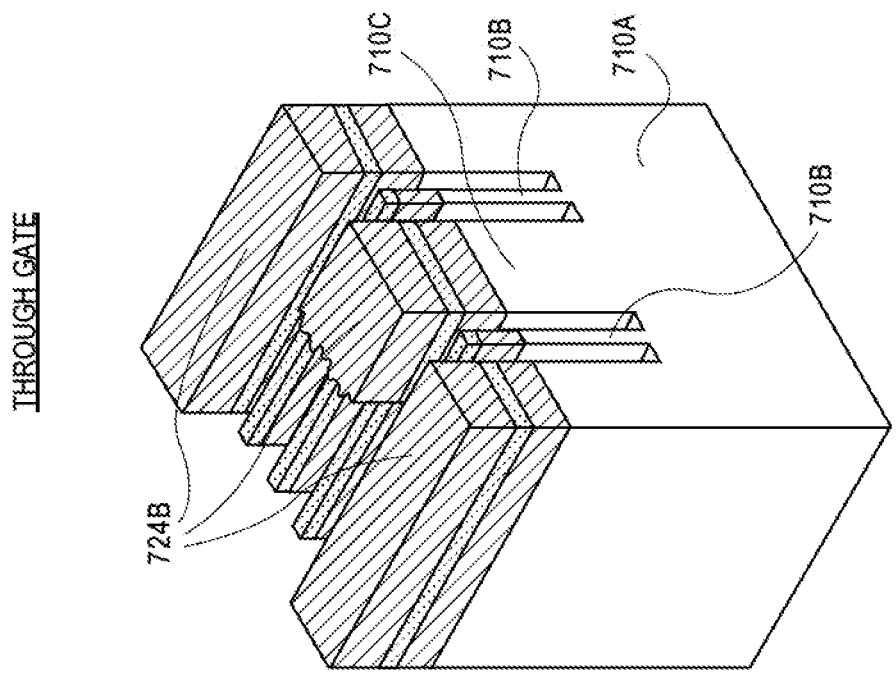
Figure 7J:
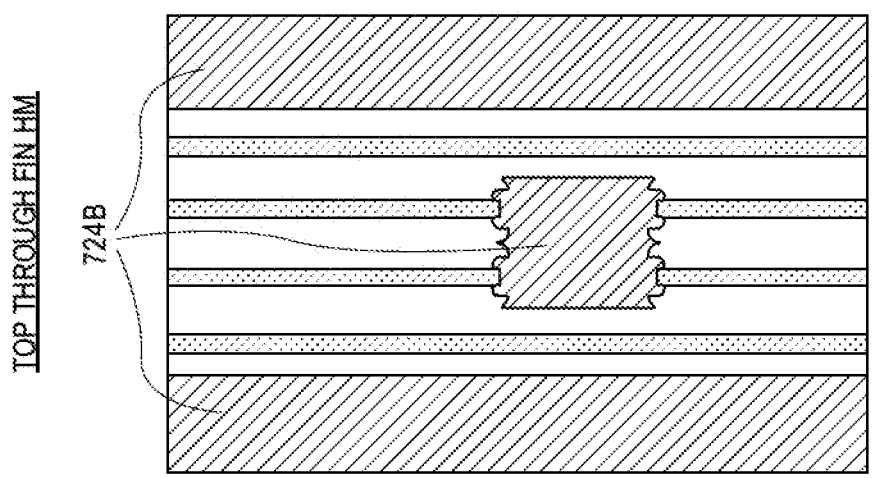
Figure 7K:
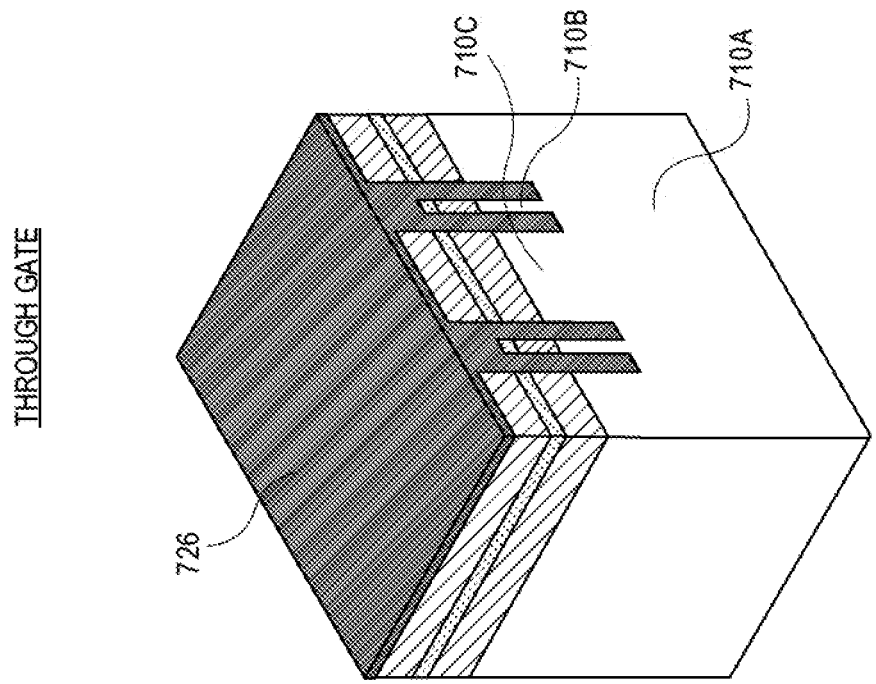
Figure 7K:
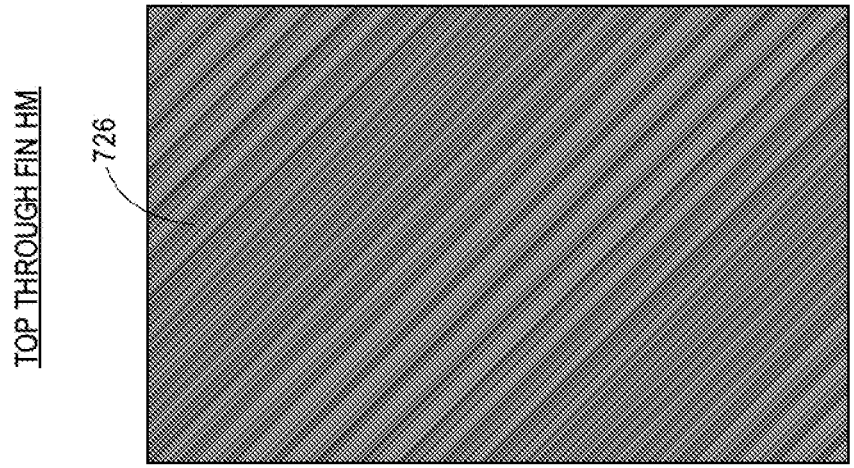

Referring to FIG. 7J, the structure of FIG. 7I is subjected to an etch process to etch substrate 710 to form patterned a patterned substrate having a lower portion 710A, fin portions 710B, and an intervening portion 710C. A dielectric fill 726, such as a silicon oxide dielectric fill, is then formed on the structure of FIG. 7J, as is depicted in FIG. 7K.

Figure 7L:
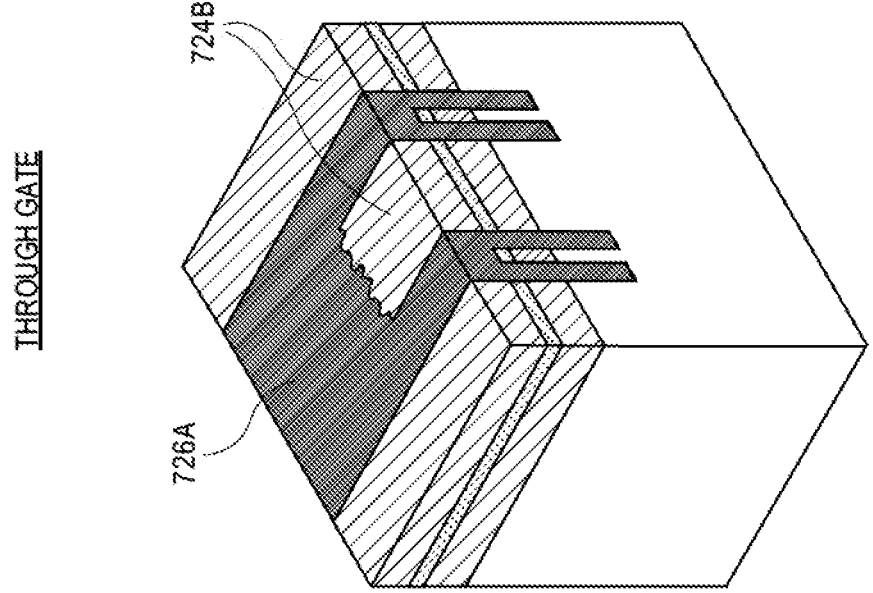
Figure 7L:
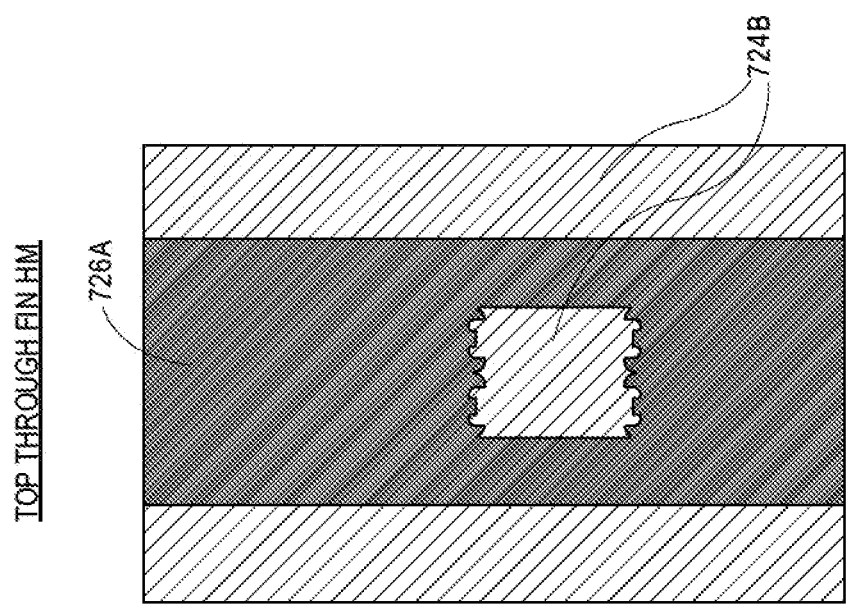
Figure 7M:
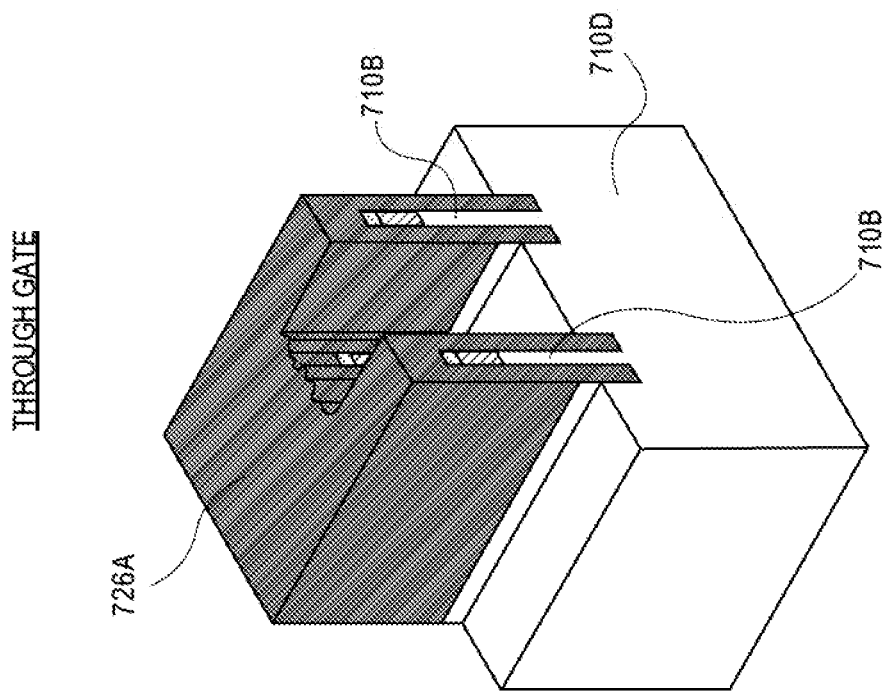
Figure 7M:
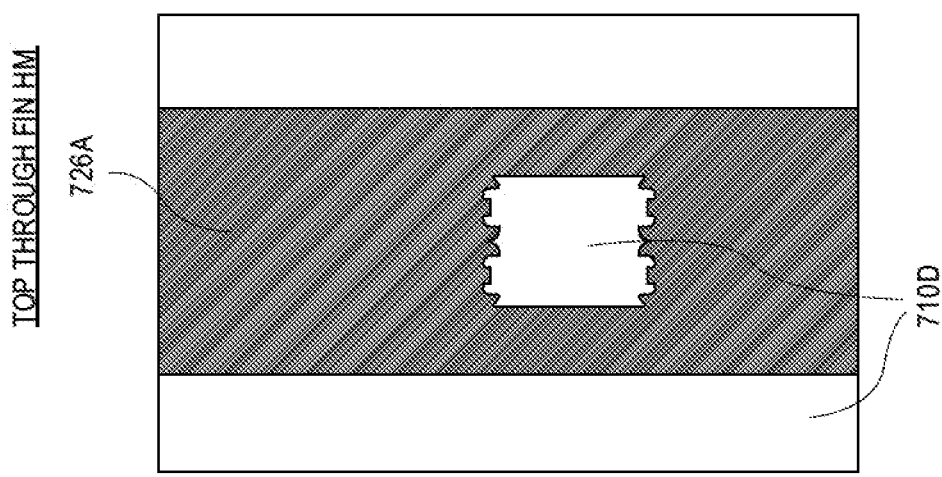

Referring to FIG. 7L, the dielectric fill 726 is planarized to form planarized dielectric fill 726A. The planarization process may use recessed dielectric block 724B as a polish stop. A self-aligned wall (SAW) etch process is then performed on the structure of FIG. 7L to form a structure including a patterned substrate having a lower portion 710D and fin portions 710B, as is depicted in FIG. 7M.

Figure 7N:
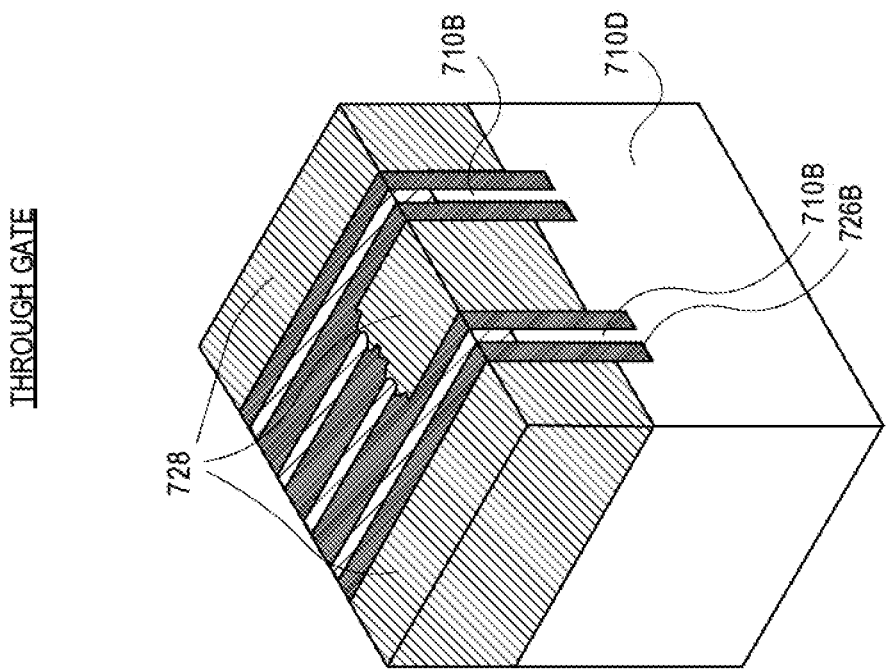
Figure 7N:
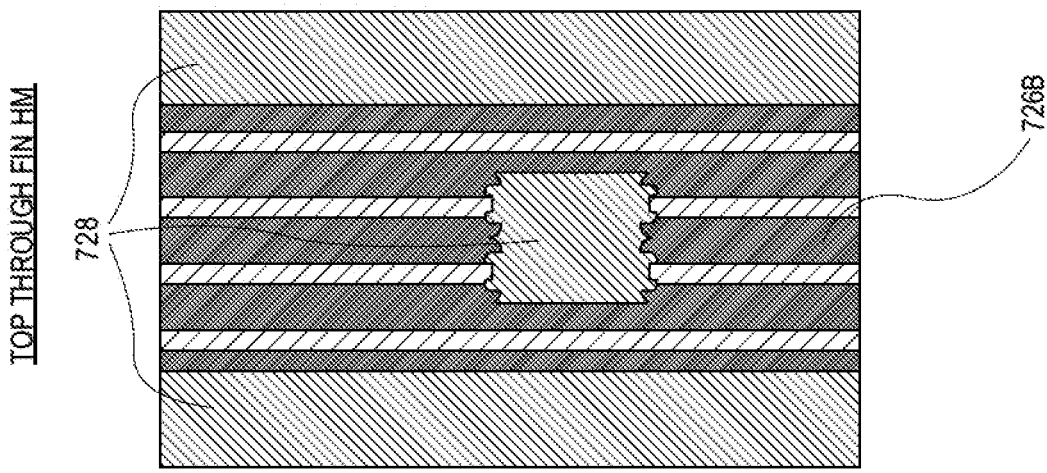
Figure 7O:
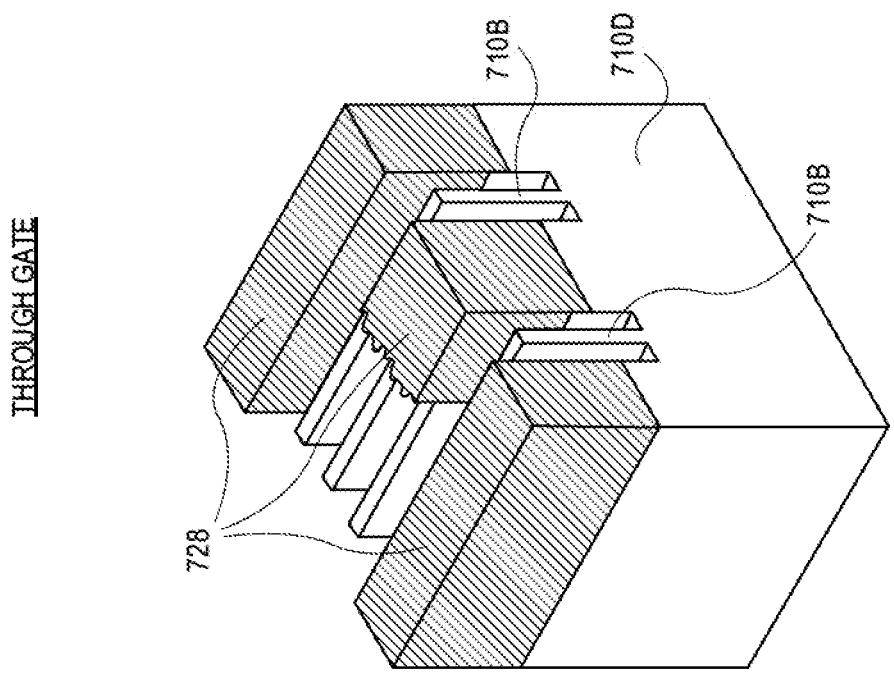
Figure 7O:
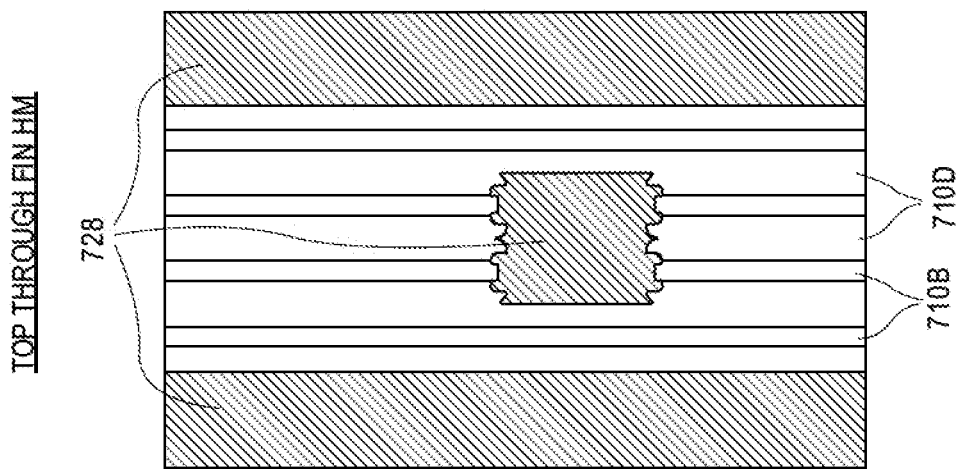

Referring to FIG. 7N, a self-aligned wall (SAW) material 728 is then formed by a deposition and planarization process, which also recesses planarized dielectric fill 726A to form recessed dielectric fill 726B. The recessed dielectric fill 726B is then removed to form the structure of FIG. 7O.

The structure of FIG. 7O can be used as a starting structure for subsequent processing that may involve the fabrication of gate lines after forming the above described SAGE wall(s) for the structure of FIG. 7O. Such gate lines may be dummy gate lines. Dummy gate lines can later be replaced with permanent gate structures, e.g., using a replacement gate process.

With reference again to part (b) of FIG. 6, and FIGS. 7A-7O, in accordance with an embodiment of the present disclosure, an integrated circuit structure includes a semiconductor fin having a cut along a length of the semiconductor fin. A gate endcap isolation structure is in a location of the cut of the semiconductor fin and in contact with the semiconductor fin. In an embodiment, the gate endcap isolation structure includes a lower dielectric portion and a dielectric cap on the lower dielectric portion, e.g., as described below in association with FIG. 9C. In an embodiment, the gate endcap isolation structure includes a vertical seam centered within the gate endcap isolation structure, e.g., as described below in association with FIG. 9C.

In another aspect, SAGE walls may vary by width, location, and function with respect to differing devices. In an exemplary implementation, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage endcap process is combined with an ultra-scaled finfet transistor architecture to provide a multi-self-aligned endcap process, where at least some of the SAGE structures (if not all) are fabricated without a fin end gap.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitations imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture. The logic transistor endcap is ultra-scaled by using the self-aligned endcap architecture, while the high-voltage transistor has a wider endcap to accommodate a thicker gate dielectric. One or both of the types of endcaps can be fabricated without a fin end gap, in accordance with embodiments described herein.

One or more embodiments described herein are directed to, or may be referred to as, a multi-unidirectional endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness.

Figure 8A:
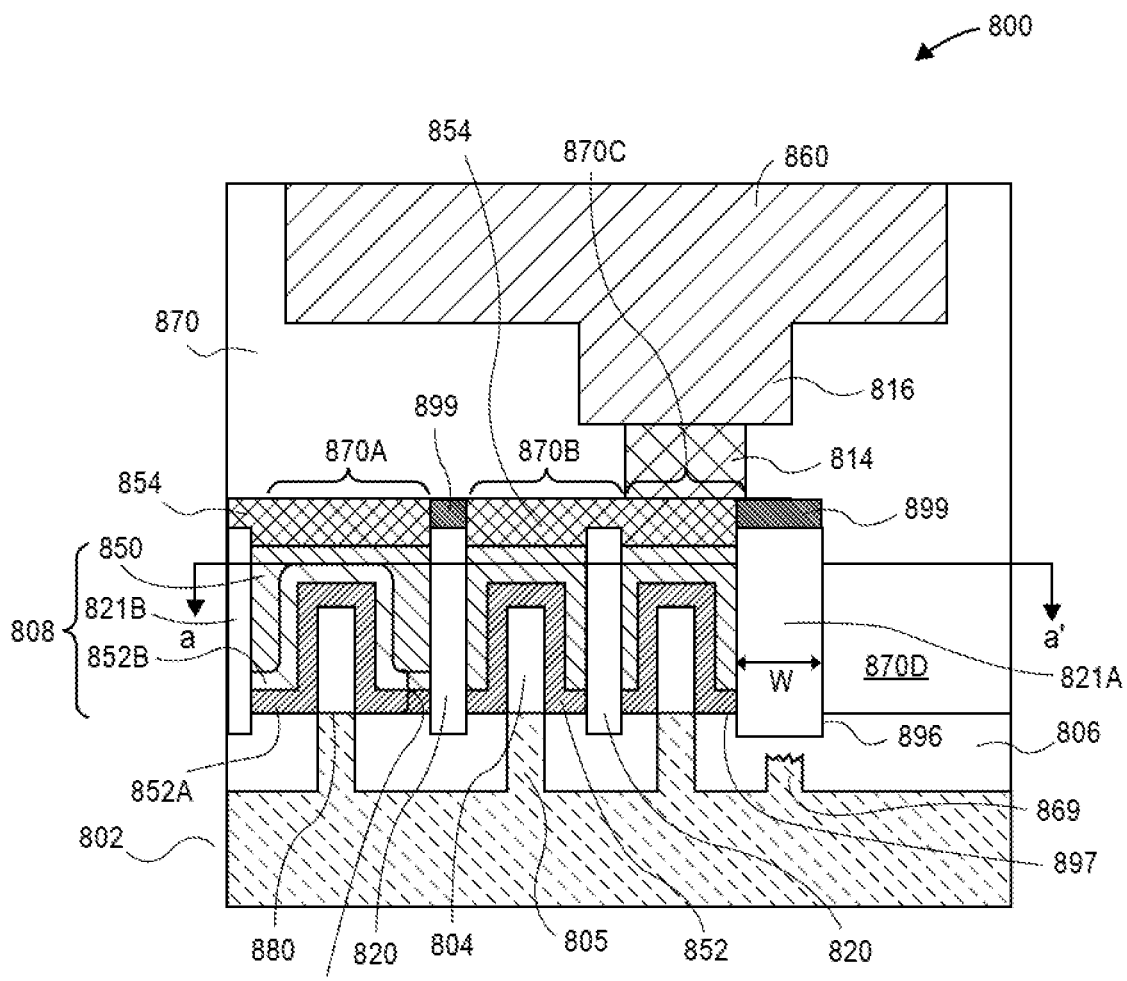
FIG. 8A illustrates a cross-sectional view of non-planar semiconductor devices having a multi-self-aligned gate endcap isolation structure architecture, in accordance with an embodiment of the present disclosure.
Figure 8B:
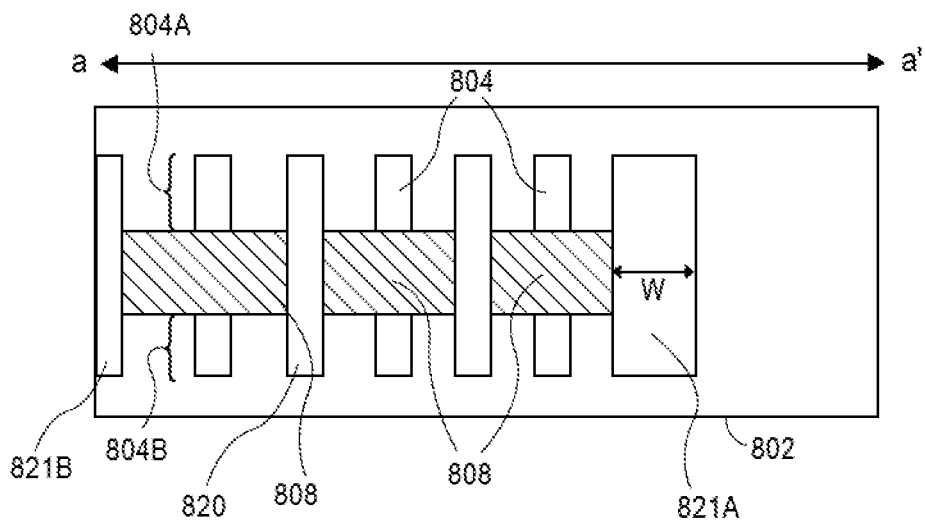
FIG. 8B illustrates a plan view taken along the a-a' axis of the semiconductor devices of FIG. 8A, in accordance with an embodiment of the present disclosure.

As an example of completed devices, FIG. 8A illustrates a cross-sectional view of non-planar semiconductor devices having a multi-self-aligned gate endcap isolation structure architecture, in accordance with an embodiment of the present disclosure. FIG. 8B illustrates a plan view taken along the a-a' axis of the structure of FIG. 8A, in accordance with an embodiment of the present disclosure.

Referring to FIG. 8A, a semiconductor structure 800 includes non-planar active regions (e.g., fin structures each including a protruding fin portion 804 and a sub-fin region 805) formed from substrate 802, and within a trench isolation layer 806. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 804 depicted may represent corresponding individual fins, or may represent a plurality of fins at a given location.

Gate structures 808 are over the protruding portions 804 of the non-planar active regions as well as over a portion of the trench isolation layer 806. As shown, gate structures 808 include a gate electrode 850 and a gate dielectric layer 852. In one embodiment, although not shown, gate structures 808 may also include a dielectric cap layer.

Gate structures 808 are separated by narrow self-aligned gate endcap (SAGE) isolation structures or walls 820, 821A or 821B. The SAGE walls 820 each have a width. In an embodiment, the SAGE wall 821A has a width greater than the width of each of the SAGE walls 820, and the SAGE wall 821B has a width less than the width of each of the SAGE walls 820. SAGE walls of differing width may be associated with different device types, as described in exemplary embodiments herein. It is to be appreciated that the varying of widths for SAGE wall can be rearranged. Also, in other embodiments, the widths are all the same. Each SAGE wall 820, 821A or 821B may include one or more of a local interconnect 854 or a dielectric plug 899 formed thereon. In an embodiment, each of the SAGE walls 820, 821A or 821B is recessed below an uppermost surface 897 of the trench isolation layer 806, as is depicted in FIG. 8A.

In accordance with an embodiment of the present disclosure, SAGE wall 821A is formed in a location of a cut fin. In a particular embodiment, SAGE wall 821A is formed over a cut portion 869 of a fin, as is depicted. In an embodiment, SAGE walls 820, 821A and 821B are fabricated subsequent to a fin cut process.

In an exemplary embodiment, the semiconductor structure 800 includes a first plurality of semiconductor fins (fin or fins 804 of region 870A) above a substrate 802 and protruding through an uppermost surface 897 of a trench isolation layer 806, and a first gate structure (gate structure 808 of region 870A) over the first plurality of semiconductor fins. A second plurality of semiconductor fins (fin or fins 804 of region 870B) is above the substrate 802 and protrudes through the uppermost surface 897 of the trench isolation layer 806, and a second gate structure (gate structure 808 of region 870B) is over the second plurality of semiconductor fins. A gate endcap isolation structure (left-hand SAGE wall 820) is between and in contact with the first gate structure and the second gate structure. A semiconductor fin of the first plurality of semiconductor fins closest to the gate endcap isolation structure (from region 870A) is spaced farther from the gate endcap isolation structure than a semiconductor fin of the second plurality of semiconductor fins closest to the gate endcap isolation structure (from region 870B).

In an embodiment, region 870A is an I/O region, and region 870B is a logic region. As depicted, in one such embodiment, a second logic region 870C is adjacent the logic region 870B, and is electrically connected to the logic region 870B by a local interconnect 854. Another region 870D may be a location where an addition logic or I/O region may be placed. Embodiments described herein may involve differential spacing from a SAGE wall (e.g., a wider spacing from SAGE walls 821B and left-hand 820 in region 870A), or may involve SAGE walls of differing width (e.g., narrower 821B versus 820 versus wider 821A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

A gate contact 814, and overlying gate contact via 816 are also seen from this perspective, along with an overlying metal interconnect 860, all of which are in inter-layer dielectric stacks or layers 870. Also seen from the perspective of FIG. 8A, the gate contact 814 is, in one embodiment, over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as over the protruding fin portions 804, as isolated by self-aligned gate endcap isolation structures 820. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of trench isolation layer 806, i.e., into the sub-fin region 805.

In an embodiment, the semiconductor structure 800 includes non-planar devices such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a group III-V material and the charge-carrier dopant impurity atoms are ones such as, but not limited to, carbon, silicon, germanium, oxygen, sulfur, selenium or tellurium.

Trench isolation layer 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 806 is composed of a dielectric material such as, but not limited to, silicon dioxide, silicon oxy-nitride, silicon nitride, or carbon-doped silicon nitride.

Self-aligned gate endcap isolation structures 820, 821A and 821B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. Additional examples are described below in association with FIGS. 9A-9C.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer includes a high-k material.

In an exemplary embodiment, the gate structure 808 of region 870A includes a first gate dielectric 852 conformal with the first plurality of semiconductor fins and laterally adjacent to and in contact with a first side of the gate endcap isolation structure (left-hand 820). The second gate stack of region 870B includes a second gate dielectric 852 conformal with the second plurality of semiconductor fins and laterally adjacent to and in contact with a second side of the gate endcap isolation structure opposite the first side of the gate endcap isolation structure. In one embodiment, the first gate dielectric is thicker than the second gate dielectric, as is depicted in FIG. 8A. In one embodiment, the first gate dielectric has more dielectric layers (e.g., layers 852A and 852B) than the second gate dielectric (e.g., only layer 852). In an embodiment, the gate dielectric of region 870A is an I/O gate dielectric, and the gate dielectric of region 870B is a logic gate dielectric.

In an embodiment, the gate dielectric of region 870B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 870A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 852A) is formed below a layer of high-k material (e.g., layer 852B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, overlying gate contact via 816, and overlying metal interconnect 860 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 8A and 8B, SAGE walls of varying width may be fabricated. It is also to be appreciated that fabrication of gate endcap isolation structures may lead to formation of a seam within the gate endcap isolation structures. It is also to be appreciated that a stack of dielectric layers may be used to form a SAGE wall. It is also to be appreciated that gate endcap isolation structures may differ in composition depending on the spacing of adjacent fins. As an example covering all such aspects, FIGS. 9A-9C illustrate cross-sectional views of process operations of significance in another self-aligned gate endcap process fabrication scheme for finFET or tri-gate devices, in accordance with an embodiment of the present disclosure.

Figure 9A:
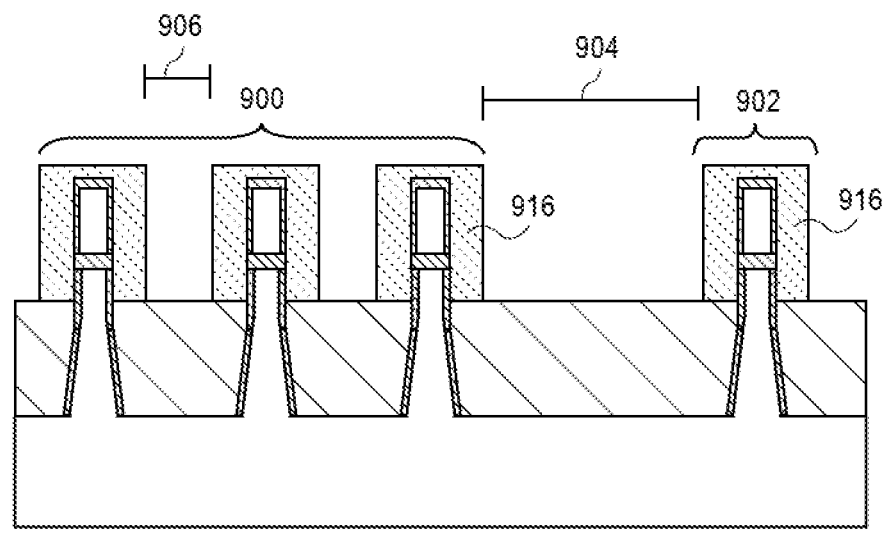
FIGS. 9A-9C illustrate cross-sectional views of process operations of significance in another self-aligned gate endcap process fabrication scheme for finFET or tri-gate devices, in accordance with an embodiment of the present disclosure.

Referring to FIG. 9A, a grouping of fins 900 has a spacing 906. The grouping of fins 900 is adjacent to a fin 902 by a larger spacing 904. Sacrificial spacers 916 are formed adjacent to sidewalls of the upper portions of each of plurality of semiconductor fins 900 and 902.

Figure 9B:
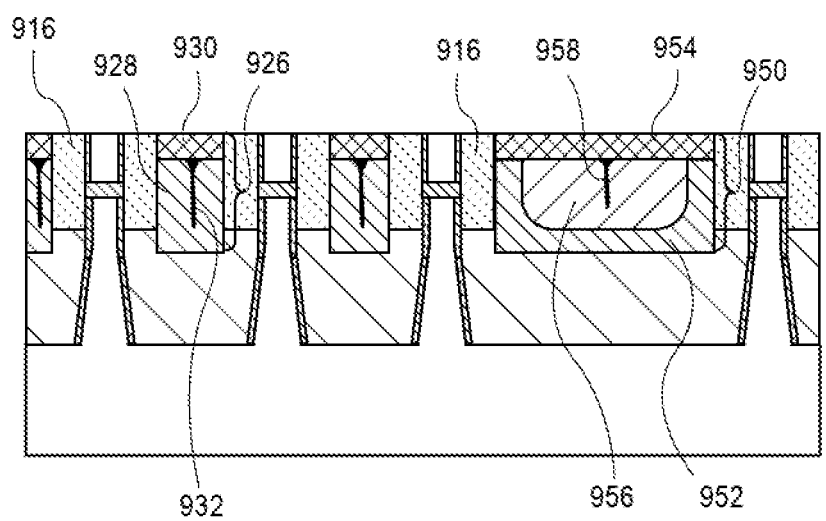
Figure 9C:
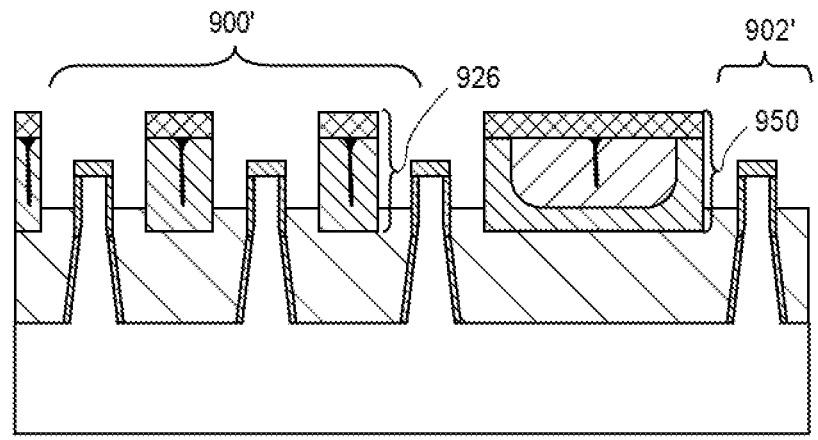

Referring to FIG. 9B, a plurality of gate endcap isolation structures 926 and 950 is formed between the sacrificial spacers 916. For the sake of the present discussion, at least some of the SAGE walls depicted are fabricated after a fin cut process. In an embodiment, as depicted, each of the plurality of gate endcap isolation structures 926 formed between spacings 906 includes a lower dielectric portion 928 and a dielectric cap 930 on the lower dielectric portion 928. In an embodiment, the plurality of gate endcap isolation structures 926 is formed by depositing and then recessing a first dielectric material, such as a silicon nitride layer, to provide the lower dielectric portions 928. The deposition process may be a conformal process which, in one embodiment, provides seams 932 within the lower dielectric portion 928. Thus, in an embodiment, each of the plurality of gate endcap isolation structures 926 includes a vertical seam 932 centered within the gate endcap isolation structure 926. A dielectric cap material, such as a metal oxide material (e.g., hafnium oxide) is then formed in recessed regions above the lower dielectric portions 928. The dielectric cap material may be planarized to form the dielectric cap 930 or may be grown upward to provide the dielectric cap 930 directly.

Referring again to FIG. 9B, in an embodiment, a gate endcap isolation structure 926 is between semiconductor fins having a spacing 906 and a gate endcap isolation structure 950 is between semiconductor fins having a spacing 904. The gate endcap isolation structure 926 has a width narrower than a corresponding width of gate endcap isolation structure 950. In one embodiment, the gate endcap isolation structure 926 has a total composition different than a total composition of the gate endcap isolation structure 950. In one such embodiment, gate endcap isolation structure 950 further includes a third dielectric layer 956, such as a layer of silicon oxide on a bottom portion of and within sidewalls of a lower dielectric portion 952. A dielectric cap 954 is further on the third dielectric layer 956. In an embodiment, the sidewalls of the lower dielectric portion 952 have an uppermost surface approximately co-planar with an uppermost surface of the third dielectric layer 956, and the dielectric cap 954 has a substantially planar bottommost surface, as is depicted in FIG. 9B. In another embodiment, the sidewalls of the lower dielectric portion 952 have an uppermost surface below an uppermost surface of the third dielectric layer 956, and the dielectric cap 954 extends further down over the sidewall locations. In yet another embodiment, the sidewalls of the lower dielectric portion 952 have an uppermost surface above an uppermost surface of the third dielectric layer 956, and the dielectric cap 954 extends further down over the third dielectric layer 956.

In an embodiment, the deposition process of third dielectric layer 956 is a conformal process which, in one embodiment, provides vertical seams 958 within the third dielectric layer 956. However, in another embodiment, a seam 958 is not formed in wider structures but is formed in narrower structures (e.g., seam 932 described above). It is to be appreciated that lower dielectric portions 928 and 952 may be composed of a same material, such as silicon nitride, and formed at a same time as one another. It is also to be appreciated that dielectric caps 930 and 954 may be composed of a same material, such as hafnium oxide, and formed at a same time as one another. The third dielectric layer 956 in structure 950 but omitted from structure 926 may be formed by conformal deposition across the entire structure but is excluded from structures 926 since the lower dielectric portions 928 essentially fills the spacing 906 in a first deposition process which does not entirely fill the spacing 904.

Referring to FIG. 9C, the sacrificial spacers 916 are removed. In an embodiment, the sacrificial spacers 916 are removed by a wet etch or dry etch process. In an embodiment, patterning stack layers above the fins are also removed to provide fins 900' and 902'.

Referring again to FIG. 9C, in an embodiment, a gate endcap isolation structure 926 or 950 is in corresponding recesses below an uppermost surface of a trench isolation layer. In an embodiment, a gate endcap isolation structure 926 or 950 includes a lower dielectric portion and a dielectric cap on the lower dielectric portion. In an embodiment, a gate endcap isolation structure 926 or 950 includes a vertical seam centered within the second gate endcap isolation structure. In an embodiment, a first gate endcap isolation structure 926 has a total composition different than a total composition of the second gate endcap isolation structure 950, e.g., by the inclusion of an additional fill dielectric material.

In an embodiment where a gate endcap isolation structure 926 or 950 includes a lower dielectric portion and a dielectric cap on the lower dielectric portion, the gate endcap isolation structure 926 or 950 may be formed by first depositing and then recessing a first dielectric material, such as a SiN layer, a SiCN layer, a SiOCN layer, a SiOC layer, or a SiC layer, to provide the lower dielectric portion. In one embodiment, the first dielectric material is a silicon nitride layer. A dielectric cap material, such as a metal oxide material (e.g., hafnium oxide, hafnium aluminum oxide, or aluminum oxide) is then formed in recessed regions above the lower dielectric portion. In one embodiment, the metal oxide material is hafnium oxide. In another embodiment, the dielectric cap material is a low-k dielectric material. The dielectric cap material may be planarized to form the dielectric cap or may be grown upward to provide the dielectric cap directly.

One or more embodiments described above are directed to selective fin sidewall spacer deposition to remove a gap between fin ends and a SAGE wall for FinFET devices. It is to be appreciated that other embodiments may include the application of such approaches for fins composed of alternating layers of two dissimilar semiconductor materials (e.g., Si and SiGe or SiGe and Ge). One of the pairs of dissimilar semiconductor materials can then be removed in the gate region to provide nanowire/nanoribbon channels for gate all-around devices. In an embodiment, an approach for gate all-around devices is similar to the approaches described above for FinFETs, with the addition of a nanowire/ribbon release operation in the gate region.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Mo, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
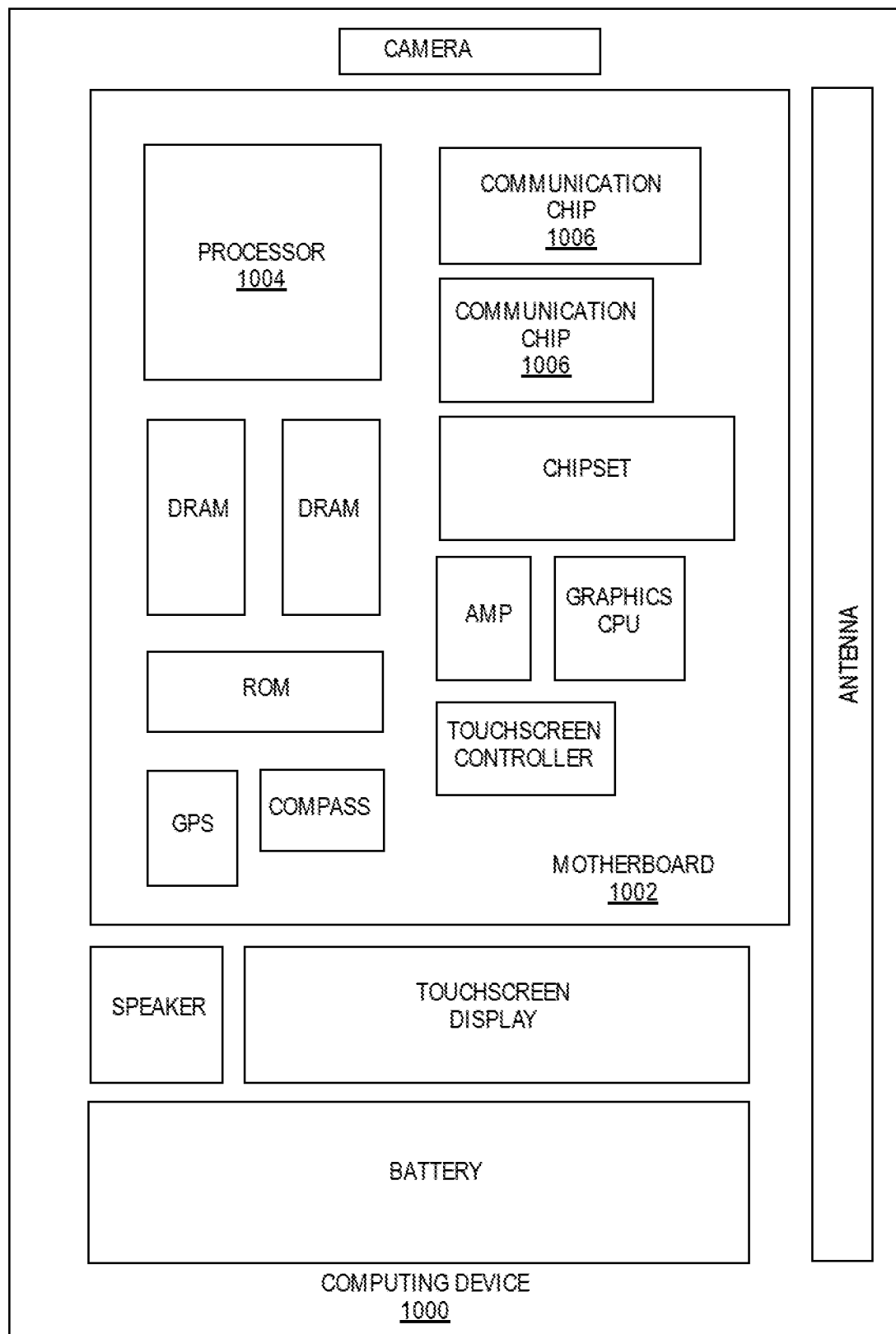
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as self-aligned gate endcap (SAGE) structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as self-aligned gate endcap (SAGE) structures built in accordance with implementations of embodiments of the present disclosure.

In further implementations, another component housed within the computing device 1000 may contain an integrated circuit die that includes one or structures, such as self-aligned gate endcap (SAGE) structures built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
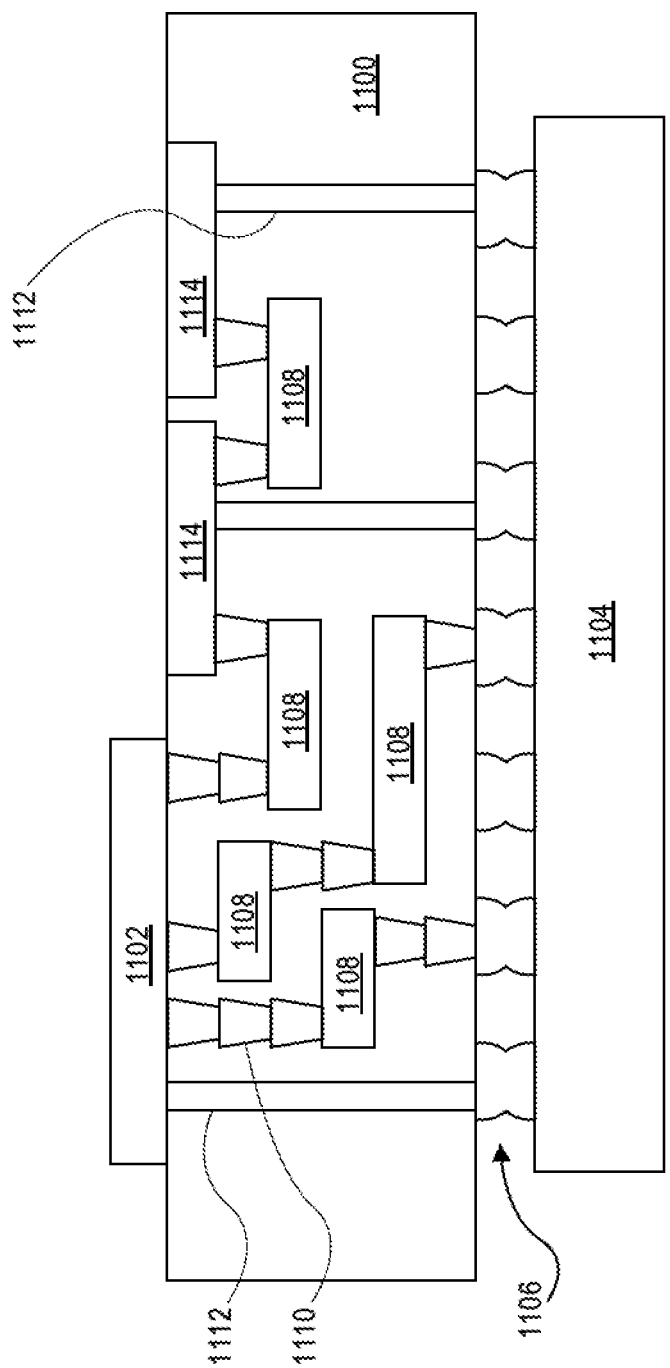
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include self-aligned gate endcap (SAGE) architectures without fin end gaps, and methods of fabricating self-aligned gate endcap (SAGE) architectures without fin end gaps.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor fin having a cut along a length of the semiconductor fin. A gate endcap isolation structure is in contact with the semiconductor fin.

Example embodiment 2: The integrated circuit structure of example embodiment 1, wherein the gate endcap isolation structure has an upper surface above an upper surface of the semiconductor fin.

Example embodiment 3: The integrated circuit structure of example embodiment 1, wherein the gate endcap isolation structure has an upper surface approximately co-planar with an upper surface of the semiconductor fin.

Example embodiment 4: The integrated circuit structure of example embodiment 1, 2 or 3, wherein the gate endcap isolation structure includes a lower dielectric portion and a dielectric cap on the lower dielectric portion.

Example embodiment 5: The integrated circuit structure of example embodiment 1, 2, 3 or 4, wherein the gate endcap isolation structure includes a vertical seam centered within the gate endcap isolation structure.

Example embodiment 6: The integrated circuit structure of example embodiment 1, 2, 3, 4 or 5, further including a gate electrode over the second portion of the gate endcap isolation structure and over the semiconductor fin at the location of the cut of the semiconductor fin.

Example embodiment 7: An integrated circuit structure includes a first semiconductor fin having a cut along a length of the first semiconductor fin. A second semiconductor fin has a cut along a length of the second semiconductor fin. A gate endcap isolation structure is in a location of the cuts of the first and second semiconductor fins and in contact with the first and second semiconductor fins.

Example embodiment 8: The integrated circuit structure of example embodiment 7, wherein the gate endcap isolation structure has an upper surface above an upper surface of the first semiconductor fin and above an upper surface of the second semiconductor fin.

Example embodiment 9: The integrated circuit structure of example embodiment 7, wherein the gate endcap isolation structure has an upper surface approximately co-planar with an upper surface of the first semiconductor fin and approximately co-planar with an upper surface of the second semiconductor fin.

Example embodiment 10: The integrated circuit structure of example embodiment 7, 8 or 9, wherein the gate endcap isolation structure includes a lower dielectric portion and a dielectric cap on the lower dielectric portion.

Example embodiment 11: The integrated circuit structure of example embodiment 7, 8, 9 or 10, wherein the gate endcap isolation structure includes a vertical seam centered within the gate endcap isolation structure.

Example embodiment 12: A computing device includes a board and a component coupled to the board. The component includes an integrated circuit structure. The integrated circuit structure includes a semiconductor fin having a cut along a length of the semiconductor fin. A gate endcap isolation structure is in a location of the cut of the semiconductor fin and in contact with the semiconductor fin.

Example embodiment 13: The computing device of example embodiment 12, further including a memory coupled to the board.

Example embodiment 14: The computing device of example embodiment 12 or 13, further including a communication chip coupled to the board.

Example embodiment 15: The computing device of example embodiment 12, 13 or 14, further including a camera coupled to the board.

Example embodiment 16: The computing device of example embodiment 12, 13, 14 or 15, further including a battery coupled to the board.

Example embodiment 17: The computing device of example embodiment 12, 13, 14, 15 or 16, further including an antenna coupled to the board.

Example embodiment 18: The computing device of example embodiment 12, 13, 14, 15, 16 or 17, wherein the component is a packaged integrated circuit die.

Example embodiment 19: The computing device of example embodiment 12, 13, 14, 15, 16, 17 or 18, wherein the component is selected from the group consisting of a processor, a communications chip, and a digital signal processor.

Example embodiment 20: The computing device of example embodiment 12, 13, 14, 15, 16, 17, 18 or 19, wherein the computing device is selected from the group consisting of a mobile phone, a laptop, a desk top computer, a server, and a set-top box.

What is claimed is:

1. An integrated circuit structure, comprising:
a first semiconductor fin having a cut along a length of the first semiconductor fin;
a gate endcap isolation structure in a location of the cut of the first semiconductor fin and in contact with the first semiconductor fin;
a second semiconductor fin laterally spaced apart from the first semiconductor fin, the second semiconductor fin continuous along the gate endcap isolation structure; and
a third semiconductor fin laterally spaced apart from the first semiconductor fin at a side of the first semiconductor fin opposite the second semiconductor fin, the third semiconductor fin having a cut along a length of the third semiconductor fin, wherein the gate endcap isolation structure is in a location of the cut of the third semiconductor fin and is in contact with the third semiconductor fin, and wherein the gate endcap isolation structure is continuous between the third semiconductor fin and the first semiconductor fin, wherein the first semiconductor fin, the second semiconductor fin and the third semiconductor fin have co-planar terminal ends.

2. The integrated circuit structure of claim 1, wherein the gate endcap isolation structure has an upper surface above an upper surface of the first semiconductor fin.

3. The integrated circuit structure of claim 1, wherein the gate endcap isolation structure has an upper surface approximately co-planar with an upper surface of the first semiconductor fin.

4. The integrated circuit structure of claim 1, wherein the gate endcap isolation structure comprises a lower dielectric portion and a dielectric cap on the lower dielectric portion.

5. The integrated circuit structure of claim 1, wherein the gate endcap isolation structure comprises a vertical seam centered within the gate endcap isolation structure.

6. A computing device, comprising:
a board; and
a component coupled to the board, the component including an integrated circuit structure, comprising:
a first semiconductor fin having a cut along a length of the first semiconductor fin;
a gate endcap isolation structure in a location of the cut of the first semiconductor fin and in contact with the first semiconductor fin;
a second semiconductor fin laterally spaced apart from the first semiconductor fin, the second semiconductor fin continuous along the gate endcap isolation structure; and
a third semiconductor fin laterally spaced apart from the first semiconductor fin at
a side of the first semiconductor fin opposite the second semiconductor fin, the third semiconductor fin having a cut along a length of the third semiconductor fin, wherein the gate endcap isolation structure is in a location of the cut of the third semiconductor fin and is in contact with the third semiconductor fin, and wherein the gate endcap isolation structure is continuous between the third semiconductor fin and the first semiconductor fin, wherein the first semiconductor fin, the second semiconductor fin and the third semiconductor fin have co-planar terminal ends.

7. The computing device of claim 6, further comprising: a memory coupled to the board.

8. The computing device of claim 6, further comprising: a communication chip coupled to the board.

9. The computing device of claim 6, further comprising: a camera coupled to the board.

10. The computing device of claim 6, further comprising: a battery coupled to the board.

11. The computing device of claim 6, further comprising: an antenna coupled to the board.

12. The computing device of claim 6, wherein the component is a packaged integrated circuit die.

13. The computing device of claim 6, wherein the component is selected from the group consisting of a processor, a communications chip, and a digital signal processor.

14. The computing device of claim 6, wherein the computing device is selected from the group consisting of a mobile phone, a laptop, a desk top computer, a server, and a set-top box.

* * * * *